United States Patent
Tanabe et al.

(10) Patent No.: US 6,403,475 B1
(45) Date of Patent: Jun. 11, 2002

(54) FABRICATION METHOD FOR SEMICONDUCTOR INTEGRATED DEVICE

(75) Inventors: Yoshikazu Tanabe, Saitama; Yasuhiko Nakatsuka, Ome; Tadashi Suzuki, Higashimurayama, all of (JP)

(73) Assignee: Hitachi, Ltd., Tokyo (JP)

( * ) Notice: Subject to any disclaimer, the term of this patent is extended or adjusted under 35 U.S.C. 154(b) by 9 days.

(21) Appl. No.: 09/588,082

(22) Filed: Jun. 6, 2000

(30) Foreign Application Priority Data

Jun. 18, 1999 (JP) .......................................... 11-172704

(51) Int. Cl.[7] .............................................. H01L 21/44
(52) U.S. Cl. ........................ 438/663; 438/663; 438/522; 438/660; 438/948; 355/57; 355/53; 355/67
(58) Field of Search ................................. 438/663, 522, 438/660, 308, 948–50; 355/55–77

(56) References Cited

U.S. PATENT DOCUMENTS

| | | | | | |
|---|---|---|---|---|---|
| 4,845,544 A | * | 7/1989 | Shimizu | ...................... | 357/71 |
| 5,011,794 A | | 4/1991 | Grim et al. | | |
| 5,196,910 A | * | 3/1993 | Moriuchi et al. | ........... | 357/23.6 |
| 5,626,680 A | * | 5/1997 | Porter et al. | ................. | 118/725 |
| 5,712,708 A | * | 1/1998 | Kasashima et al. | ......... | 356/401 |
| 5,830,277 A | * | 11/1998 | Johnsgard et al. | .......... | 118/725 |
| 5,838,908 A | * | 11/1998 | Matzke et al. | ............ | 395/200.6 |
| 5,991,508 A | * | 11/1999 | Ohmine et al. | ............. | 392/418 |
| 6,025,266 A | * | 2/2000 | Katoh | ........................ | 438/653 |
| 6,030,509 A | * | 2/2000 | Fu-Kang et al. | ........ | 204/192.12 |
| 6,035,101 A | * | 3/2000 | Sajoto et al. | ............... | 392/416 |
| 6,043,460 A | * | 3/2000 | Johnsgard et al. | .......... | 219/390 |
| 6,134,174 A | * | 10/2000 | Takase | ................... | 365/230.06 |

FOREIGN PATENT DOCUMENTS

| | | | | |
|---|---|---|---|---|
| JP | 59-32131 | * | 2/1984 | ........... H01L/21/30 |
| JP | 62094925 | | 5/1987 | |
| JP | 62250633 | | 10/1987 | |
| JP | 01110726 | | 4/1989 | |
| JP | 01117319 | | 5/1989 | |
| JP | 2303121 | | 12/1990 | |
| JP | 03006018 | | 1/1991 | |
| JP | 05291170 | | 11/1993 | |
| JP | 06232138 | | 8/1994 | |
| JP | 10321547 | | 12/1998 | |

OTHER PUBLICATIONS

ULSI Technology Chapter 4 Conventional and Rapid Thermal Processes by Richard B. Fair pp. 144–205.

* cited by examiner

*Primary Examiner*—Matthew Smith
*Assistant Examiner*—Granvill D Lee, Jr.
(74) *Attorney, Agent, or Firm*—Antonelli, Terry, Stout & Kraus, LLP

(57) ABSTRACT

Annealing technology is capable of heating a wafer on which a copper film is formed at a desired temperature within a short period of time. A light-shielding plate 106 of SiC (silicon carbide) exhibiting a flat emissivity irrespective of the wavelengths and emitting light over a wide band of wavelengths is interposed between the wafer 1 on which is formed a copper film having a high light reflection factor and lamps 102. The lamps 102 are turned on in this state so that the light-shielding plate 106 is heated, first, and, then, the wafer 1 is heated by light radiated from the light-shielding plate 106 that is heated, thereby to anneal the copper film.

19 Claims, 25 Drawing Sheets

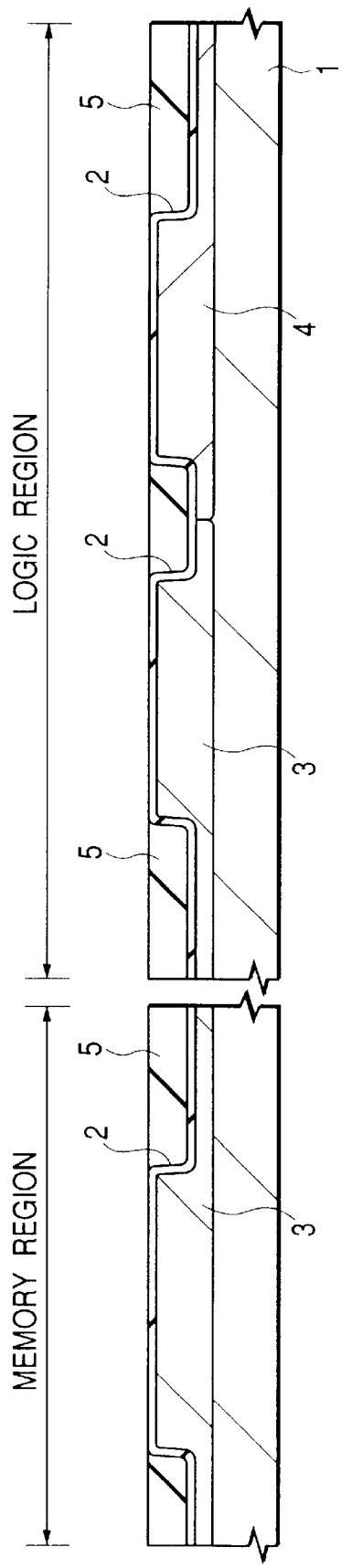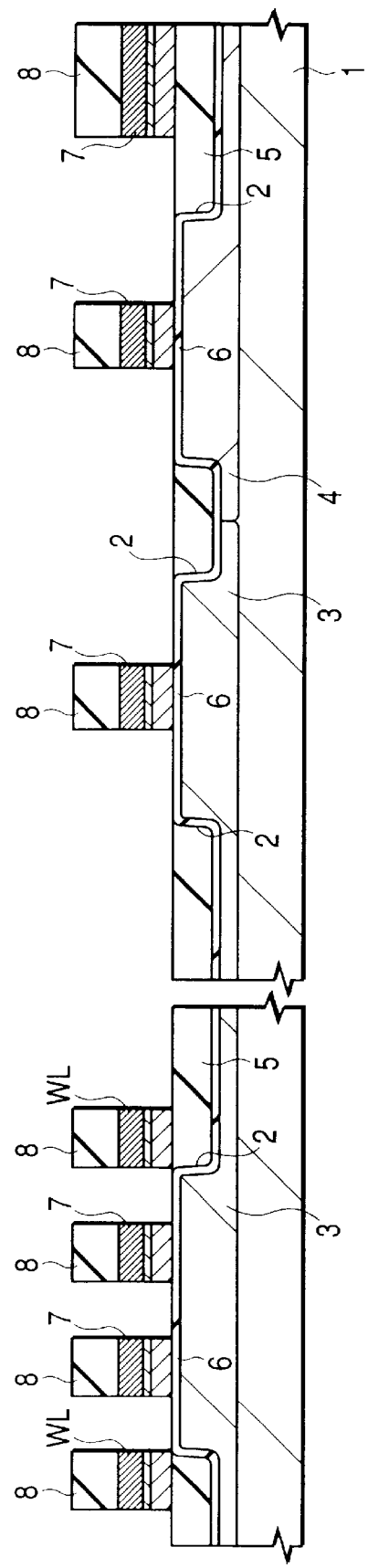

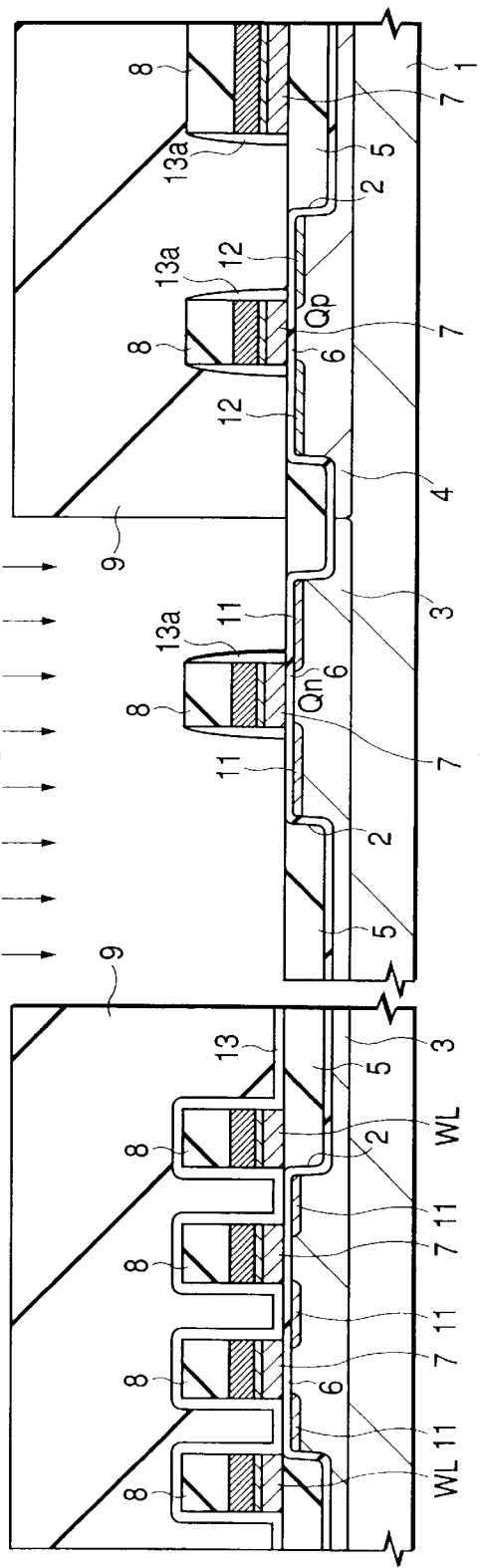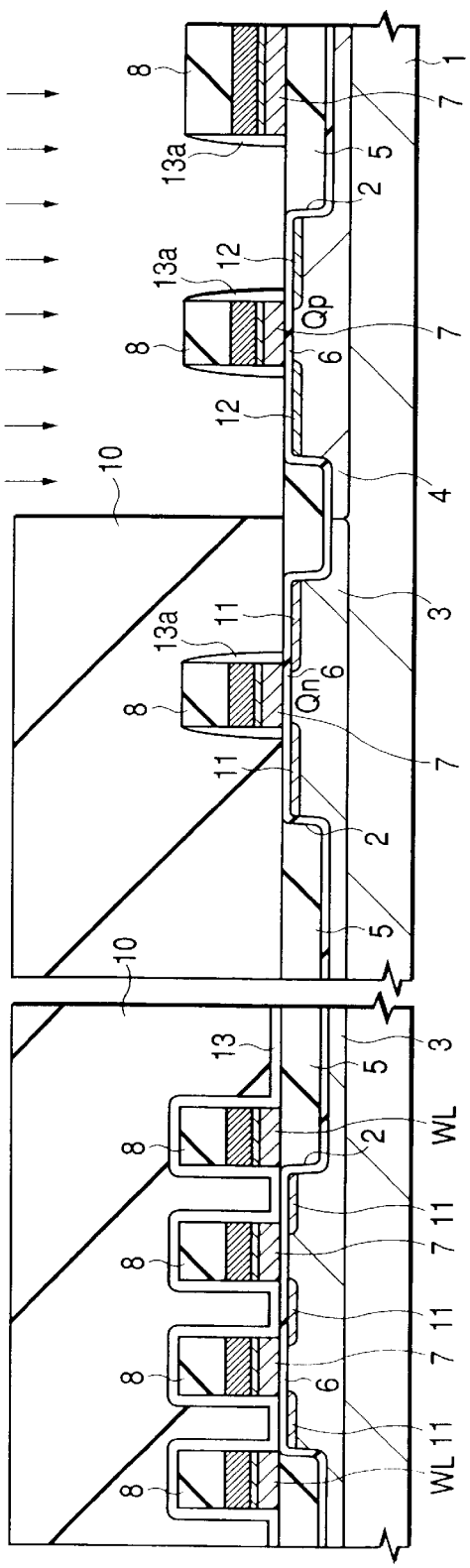

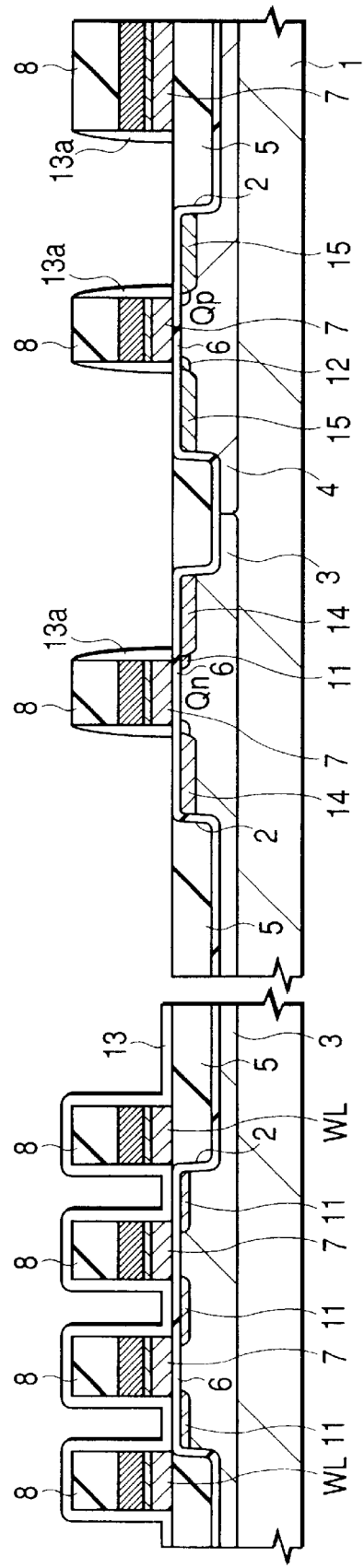
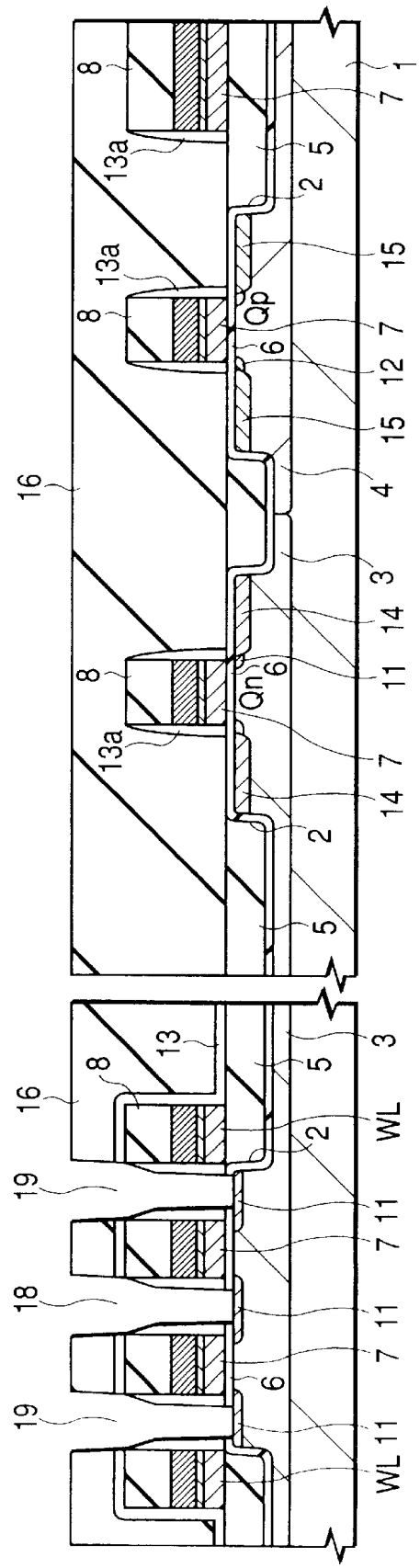

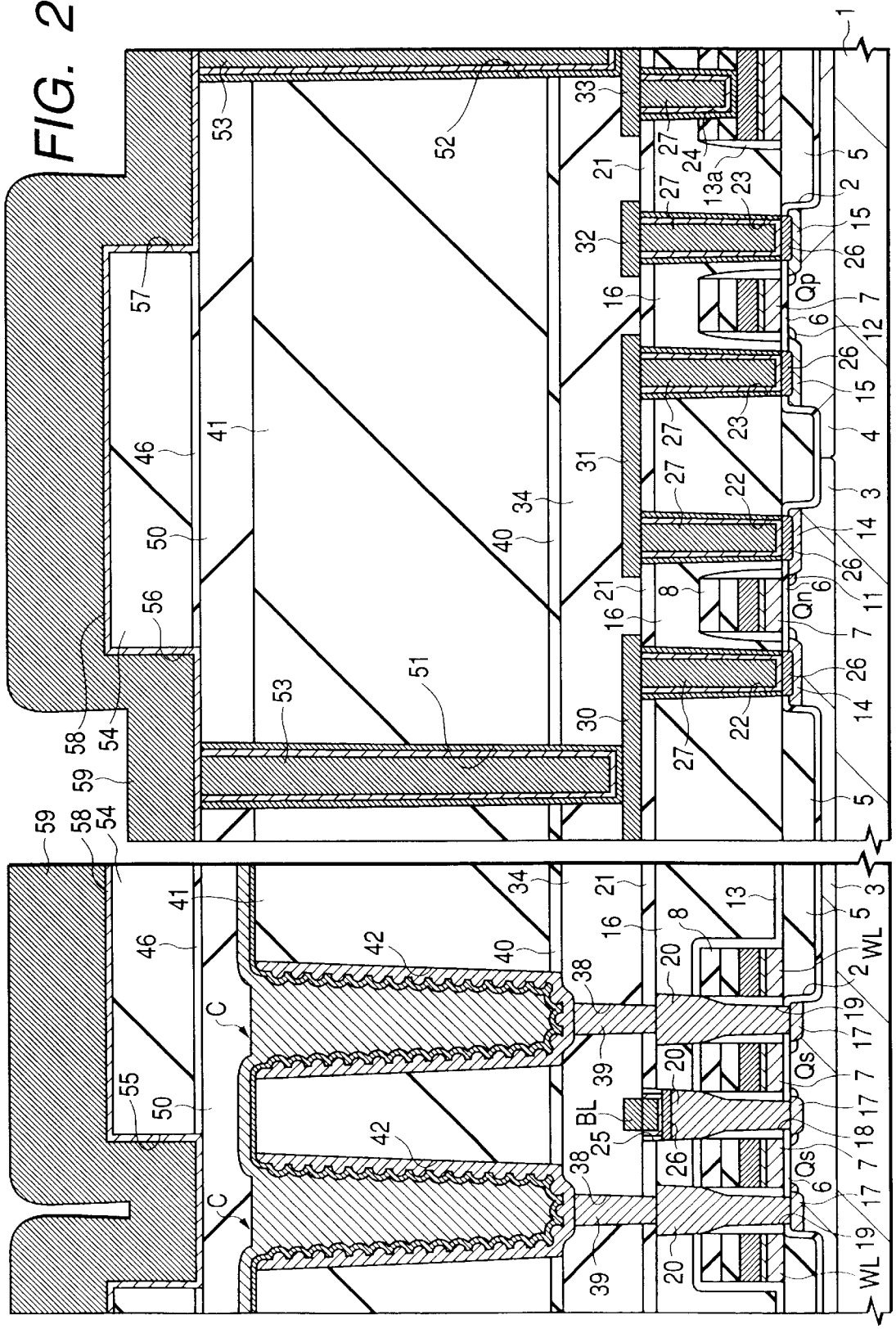

FABRICATION METHOD FOR SEMICONDUCTOR INTEGRATED DEVICE

BACKGROUND OF THE INVENTION

The present invention relates to technology for fabricating semiconductor integrated circuit devices and, more particularly, to a technology that can be effectively applied to a semiconductor-manufacturing process for heat-treating wafers based on an RTA (rapid thermal annealing) system using lamps as a heat source.

ULSI Technology (by C. Y. Chang, S. M. Sze, published by McGraw-Hill Co., 1996, pp. 144–204) discloses in detail an RTP (rapid thermal process) for use in the manufacture of semiconductors.

Japanese Patent Laid-Open No. 250633/1987 (Inoue) discloses a halogen lamp annealing device in which a plurality of mat glass plates having a rugged pattern on the surfaces thereof are arranged between a semiconductor wafer and a source of light (halogen lamp). According to this device, light arriving at the wafer from the source of light is scattered in a multiplicity of stages due to the rugged surfaces of the mat glass plates, and the distribution of the intensities of light falling on the wafer surfaces is uniformalized, preventing the occurrence of surface defects on the wafer surfaces and slipping. As the mat glass which is placed between the wafer and the source of light, there can be used a ground glass and a figured glass such as currently available in the market.

Japanese Patent Laid-Open No. 94925/1987 (Ohno) discloses a heat-treating (annealing) device in which a transparent quartz holder for supporting a wafer is covered with a covering film. According to this device, the covering film is first heated by light from a source of light (halogen lamp) and, then, the wafer is heated by light radiated from the covering film. It is claimed that the temperature distribution is uniformalized on the surfaces of the wafer irrespective of the surface condition of the wafer such as a difference in the thickness of the oxide film. The covering film is formed of a heat-resistant material such as titanium (Ti).

Japanese Patent Laid-Open No. 110726/1989 (Yabuki) discloses a lamp annealing method in which an absorbent is arranged on the main surface of the, but a small distance is maintained from the wafer. According to this method, it is claimed that the heat energy of the absorbent heated by the lamp is given to the wafer due to the thermal convection, thereby decreasing dispersion in the heated temperature on the surface of the wafer. The absorbent is formed of silicon carbide (SiC) or a carbon member having a diameter slightly larger than that of the wafer.

Japanese Patent Laid-Open No. 117319/1989 (Kanazawa) discloses a method of forming a shallow impurity-diffused layer on a silicon wafer while maintaining uniformity and reproduciability by using a lamp annealing device instead of using the conventional diffusion furnace. In the chamber of the lamp annealing device used here, a boron plus plate and a PBN plate which are solid sources of diffusion are arranged so as to be opposed to the silicon wafer, and the solid sources of diffusion and the wafer are heated simultaneously and rapidly in a vacuum, so that impurities are diffused in the silicon wafer from the solid sources of diffusion.

Japanese Patent Laid-Open No. 303121/1990 (Karen A. Grim, et al.) discloses a method of effecting rapid thermal annealing (RTA) by accommodating a wafer in a container called a black box. This container is equipped with a lid for sealing a cavity that comprises a base for supporting the wafer and an annular guard ring surrounding the wafer, which container absorbs almost all radiant energy emitted from a halogen lamp which is the source of light, and radiates this energy. It is claimed that when the wafer in which impurity ions are injected is rapidly and thermally annealed in the container, the impurities are activated almost without developing any defect, such as slip lines, on the wafer.

Japanese Patent Laid-Open No. 6018/1991 (Imaizumi) discloses a lamp annealing device in which tungsten-halogen lamps are arranged on both the upper and lower sides of a quartz chamber accommodating a susceptor for placing a wafer, and a plurality of opaque quartz plates at variable angles are arranged between the quartz chamber and the halogen lamp. According to this device, the angles of the opaque quartz plates are changed so that the temperature at the peripheries of the wafer from where heat easily radiates becomes equal to the temperature at the center, thereby improving the uniformity in the distribution of temperatures on the surface of the wafer.

Japanese Patent Laid-Open No. 291170/1993 (Nukii) discloses a lamp annealing device in which a net obtained by knitting a metal wire such as of Ni (nickel) in the form of a grid is arranged between a halogen lamp and a wafer. When the annealing is effected by arranging the net between the wafer and the lamp, the intersecting portions of the metal wires become point sources of light, and it is claimed that the net as a whole works as a plane source of light enhancing the uniformity in the distribution of temperatures on the surface of the wafer.

Japanese Patent Laid-Open No. 232138/1994 (Hisaka) discloses a lamp annealing device equipped with a halogen lamp for heating the whole wafer and an auxiliary heater for heating the peripheries of the wafer. The auxiliary heater comprises carbon heaters or halogen lamps which are arranged to surround the susceptor. According to this device, the power of the auxiliary heater is controlled to adjust the difference of temperature between the peripheries in the wafer and the central portion thereof, making it possible to highly uniformly anneal the wafer without causing distortion.

Japanese Patent Laid-Open No. 321547/1998 (Ishihara, et al.) discloses a heat-treating device in which halogen lamps are provided on the upper surface and on the lower surface of a quartz container for containing the wafer, and heat-equalizer plates are provided on the upper surface side and on the lower surface side of the wafer in the container. The pair of heat-equalizer plates are formed in the shape of a disk and are arranged nearly in parallel with the wafer. One heat-equalizer plate has a diameter larger than that of the wafer and has a circular hole perforated in the central portion thereof. The other heat-equalizer plate has a diameter nearly equal to that of the above heat-equalizer plate (materials of the pair of heat-equalizer plates have not been disclosed). It is claimed that according to this device, dispersion in the temperature distribution is suppressed on the surfaces of the wafer due to the arrangement of the heat-equalizer plates on both sides of the wafer.

In a modern process for fabricating logic LSIs of high performance, the resistance of the Al (aluminum) wiring is increasing and the reliability is decreasing as the wirings are formed ever more finely, accounting for a major factor for impairing the fabrication of LSIs of high performance.

There has been an attempt to employ buried copper wiring formed by the so-called Damascene method by forming wiring grooves (and through holes) in the insulating film deposited on the silicon (Si) substrate, depositing a copper film having an electric resistance smaller than the Al film on the insulating film which includes the interiors of the wiring grooves (and through holes), and removing the unnecessary copper film on the outside of the wiring grooves by a chemical mechanical polishing (CMP) method (Japanese Patent Laid-Open Nos. 278822/1990, 214834/1998, etc.).

Since a suitable source gas has not yet been found, it is at present difficult to form a copper film by the CVD method and, hence, the sputtering method or the plating method has chiefly been used. When the copper film is deposited by sputtering on the insulating film in which the wiring grooves have been formed, the copper film is not buried to a sufficient degree in the wiring grooves. It, therefore, becomes necessary to enhance the fluidity of the copper film by annealing to cause a reflow of the copper film into the wiring grooves. The copper film formed by the plating method, too, must be annealed after it has been formed to improve its film quality.

Silicon has a property to absorb light exhibiting a peak in a wavelength region of about 1 µm. Therefore, the silicon wafer is annealed by using a W (tungsten)-halogen lamp that emits light of a wavelength of about 1 µm. When the copper film is annealed by RTA using a lamp as a heat source, however, light of the wavelength of about 1 µm is almost all (99% or more) reflected by copper. Therefore, a very large lamp power is required for obtaining a wafer temperature necessary for the annealing, thereby raising a problem of an increase in the consumption of electric power by the lamp. Further, when the surface of the wafer includes a portion where a copper film is formed and a portion where no copper film is formed, there locally develops a difference in the temperature on the surface of the wafer due to a difference in the reflection factor for the light of the lamp.

Dispersion in the temperature on the surface of the wafer when the wafer is irradiated with light from the lamp also stems from the density of the integrated circuit patterns formed on the wafer. For example, when the memory region and the logic region exist in a mixed manner in a unit chip region of the wafer like the memory-logic hybrid LSI, the memory region where the elements are highly densely formed absorbs light to a greater extent more than the logic region where the elements are not densely arranged, giving rise to the occurrence of a local difference in the temperature in the unit chip region.

SUMMARY OF THE INVENTION

An object of this invention is to provide annealing technology which does not cause dispersion in the temperature on the surfaces of the wafer.

Another object of this invention is to provide annealing technology which does not cause local dispersion in the temperature caused by the density of the integrated circuit pattern.

A further object of this invention is to provide annealing technology capable of heating the wafer on which a copper film is formed to a desired temperature within a short period of time.

The above and other objects as well as novel features of the invention will become obvious from the description of the specification and the accompanying drawings.

Briefly described below are representative examples of the invention disclosed in this application.

According to the fabrication method for semiconductor integrated circuit devices of the invention, a light-shielding plate of SiC (silicon carbide) is interposed between the lamps and a wafer on which there is formed a copper film having a high light reflection factor, the lamps are turned on in this state to, first, heat the light-shielding plate and, then, heat the main surface of the wafer by light radiated from the heated light-shielding plate, thereby to anneal the copper film.

The light-shielding plate of a ceramic such as SiC exhibits flat emissivity irrespective of the wavelengths and radiates light over a wide band of wavelengths, and makes it possible to heat the copper film to a desired temperature within a short period of time compared with when the wafer is directly heated by light from the lamps. This further makes it possible to decrease a difference in the temperature between the region where the copper film is formed and the region where no copper film is formed on the main surface of the wafer.

BRIEF DESCRIPTION OF THE DRAWINGS

FIG. 1 is a sectional view illustrating a major portion of a semiconductor substrate to explain a fabrication method for semiconductor integrated circuit devices according to an embodiment of the invention;

FIG. 2 is a sectional view illustrating a major portion of the semiconductor substrate to explain the fabrication method for semiconductor integrated circuit devices according to the embodiment of the invention;

FIG. 5 is a sectional view illustrating a major portion of the semiconductor substrate to explain the fabrication method for semiconductor integrated circuit devices according to the embodiment of the invention;

FIG. 6 is a sectional view illustrating a major portion of the semiconductor substrate to explain the fabrication method for semiconductor integrated circuit devices according to the embodiment of the invention;

FIG. 11 is a sectional view illustrating a major portion of the semiconductor substrate to explain the fabrication method for semiconductor integrated circuit devices according to the embodiment of the invention;

FIG. 12 is a sectional view illustrating a major portion of the semiconductor substrate to explain the fabrication method for semiconductor integrated circuit devices according to the embodiment of the invention;

FIG. 24 is a sectional view illustrating a major portion of the semiconductor substrate to explain the fabrication method for semiconductor integrated circuit devices according to the embodiment of the invention;

DETAILED DESCRIPTION OF THE INVENTION

Figure 3:
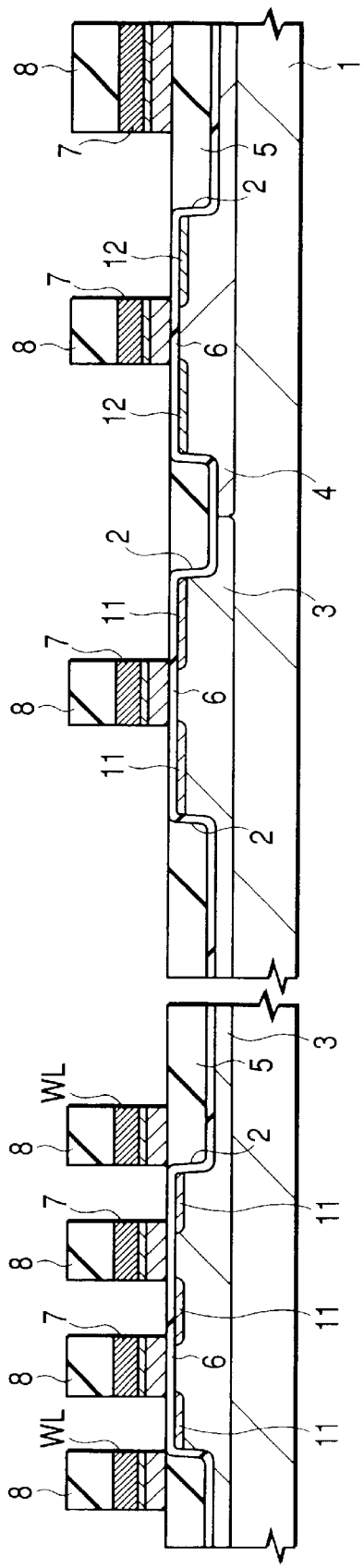
FIG. 3 is a sectional view illustrating a major portion of the semiconductor substrate to explain the fabrication method for semiconductor integrated circuit devices according to the embodiment of the invention.

Described below are the general meanings of some of the terms used in this application.

The terms "semiconductor integrated circuit wafer" and "semiconductor wafer" (or simply "wafer") stands for a single crystalline silicon substrate (generally, nearly circular), a sapphire substrate, a glass substrate or any other insulating, semi-insulating or semiconductor substrate and a composite substrate thereof used for fabricating semiconductor integrated circuit devices. Further, the term "semiconductor integrated circuit device" (or "electronic device", "electronic circuit device", etc.) includes not only those devices that are fabricated on a single crystalline silicon substrate but also those fabricated on the above-mentioned various substrates as well as on an SOI (silicon-on-insulator) substrate, a substrate for producing TFT (thin film transistor) liquid crystals and a substrate for producing STN (super twisted nematic) liquid crystals unless stated otherwise.

The term "device surface" stands for a main surface of the wafer or a surface on which are formed device patterns corresponding to a plurality of unit chip regions relying upon photolithography technology.

The term "chip-forming portion" stands for a portion including a plurality of unit chip regions on the device surface of the wafer, or an internal region excluding the periphery on which it is not intended to form a chip.

The term "hybrid ratio" stands for an area ratio of a memory region (inclusive of memory cell array and peripheral circuit) occupying the unit chip region, or a percentage of the area of the memory region divided by the area of (memory region+logic region).

The term "SiC heat capacity converted thickness" (or simply "converted thickness") of a given material stands for a thickness given by $T_r=T\times (C/C_0)$ (i.e., thermally effective thickness compared in terms of heat capacity), wherein C is the heat capacity of the material per unit volume, $C_0$ is the heat capacity of SiC per unit volume, and T is the real thickness of the material.

EXAMPLE 1

When the wafer has a thickness of 0.8 mm and the light-shielding plate of SiC has a thickness of 0.8 mm, the light-shielding plate has a converted thickness of 0.8 mm.

EXAMPLE 2

When the wafer has a thickness of 0.8 mm and the light-shielding plate has a thickness of 0.8 mm, the light-shielding plate being made of a material having a heat capacity which is twice as great as that of SiC per a unit, then, the light-shielding plate has a converted thickness of 2×0.8 mm=1.6 mm.

The term "optically uniform" indicates that the dispersion in the surface shape, such as coarseness of patterns or presence of patterns that cause the reflection factor of the surface to become irregular, is smaller than that of the device surface of the wafer.

The term "highly dielectric material" indicates a dielectric material having a specific inductivity of not smaller than 20, such as $Ta_2O_5$ (tantalum oxide) or a dielectric material of the perovskite type having a specific inductivity of not smaller than 100, such as BST ((Ba, Sr)$TiO_3$) (barium strontium titanate).

The term "ferroelectric material" indicates a dielectric material such as PZT, PLT, PLZT, SBT, PbTiO$_3$, SrTiO$_3$ or BaTiO$_3$ having a perovskite structure which is in the ferroelectric phase at normal temperature.

The term "chemical mechanical polishing: CMP" indicates a process for polishing a surface by relatively moving the surface in the direction of the surface while supplying slurry in a state where the surface to be polished is brought in contact with a polishing pad formed of a sheet material such as a soft cloth. In this application, this also includes CML (chemical mechanical lapping) for polishing the surface to be polished while moving the surface relative to a hard grindstone surface.

The term "buried wiring" indicates a wiring formed by a wiring-forming technology by burying an electrically conducting film in grooves formed in a insulating film and, then, removing an undesired electrically conducting film on the insulating film like, generally, that of a single damascene or a dual damascene.

The term "metal" usually includes ordinary metals such as Cu and Al (aluminum) as well as refractory metals, but does not include silicon (Si) and silicide.

An embodiment of the invention will now be described in detail with reference to the drawings. In the drawings for illustrating the embodiment, the same members are denoted by the same reference numerals but are not described repeatedly. The same or similar portions are described once but are not repetitively described unless particularly needed.

Further, when necessary, the embodiment will be described as being divided into a plurality of sections or embodiments. Unless clearly stated, however, they are not irrelevant to each other, and one has a relationship for describing in detail or for compensating a modified example of a portion or the whole of the other one.

In the following embodiment, further, when specific of elements (number, numerical value, quantity, range, etc.) are referred to, the invention is not particularly limited thereto, but may be larger than, or smaller than, the particular numbers except when they are clearly stated or obviously limited to particular numbers in principle. In the following embodiment, further, the constituent elements (inclusive of required steps) are not necessarily essential except when they are clearly stated or are obviously considered to be essential in principle.

In the following embodiment, further, when the shapes of constituent elements and their positional relationships are referred to, those which are substantially close thereto or similar thereto are also included except when they are clearly stated and are obviously considered to be contrary thereto in principle. This also holds even concerning the above numerical values and ranges.

The method of fabricating a memory-logic hybrid LSI representation an embodiment of the invention will now be described as a sequence of steps with reference to FIGS. 1 to 31. Among these drawings, the left side in cross section of the substrate represents a memory region (memory cell array) of the DRAM (dynamic random access memory) and the right side represents a CMOS-logic region.

Referring, first, to FIG. 1, element isolation grooves 2 are formed in a main surface (device surface) of a p-type single crystalline silicon substrate (hereinafter simply referred to as a substrate or wafer) 1 having a resistivity of, for example, from about 1 to about 10 Ωcm and, then, p-type impurities (boron (B) ions) are injected into a portion of the substrate 1 to form a p-type well 3 and n-type impurities (phosphorus (P) ions) are injected into another portion to form an n-type well 4.

To form the element isolation grooves 2, the element isolation region of the substrate 1 is etched to form grooves of a depth of about 350 nm and, then, a silicon oxide film 5 is deposited inside the grooves and on the substrate 1 by the CVD (chemical vapor deposition) method and, then, the silicon oxide film 5 outside the grooves is removed by the chemical mechanical polishing (CMP) method.

Next, as shown in FIG. 2, the substrate 1 is wet-oxidized to form a gate oxide film 6 having a thickness of about 6 nm on the surfaces of the p-type well 3 and the n-type well 4 and, then, a gate electrode 7 is formed on the gate oxide film 6 having a gate length of from 0.13 µm to 0.14 µm. To form the gate electrode 7, a polycrystalline silicon film doped with n-type impurities such as of phosphorus (P) is deposited by the CVD method on the substrate 1 maintaining a thickness of about 100 nm, followed by the deposition of a tungsten nitride (WN) film maintaining a thickness of about 5 nm and a tungsten(W) film maintaining a thickness of about 50 nm by sputtering. Then, a silicon nitride film 8 is deposited thereon by the CVD method maintaining a thickness of about 100 nm. Then, these films are patterned by dry-etching using the photoresist film as a mask. The gate electrode 7 formed on the memory region works as a word line WL.

After the gate oxide film 6 is formed, the substrate 1 may be annealed in a nitrogen-containing gaseous atmosphere such as of NO (nitrogen oxide) or N$_2$O (nitrous oxide) prior to the step of forming the gate electrode 7 in order to segregate nitrogen on the interface between the gate oxide film 6 and the substrate 1. The annealing is not an essential step. As the thickness of the gate oxide film 6 decreases, however, stress builds up on the interface between the two due to a difference in the coefficient of thermal expansion from the substrate 1 to induce the generation of hot carriers. Nitrogen segregated on the interface between the gate oxide film 6 and the substrate 1 relaxes the stress. Therefore, the annealing helps improve the reliability and breakdown voltage of the gate oxide film 6. When the annealing is to be effected, it is desired to use an annealing device that will be described later.

Referring, next, to FIG. 3, n-type impurities (phosphorus or arsenic (As) ions) are injected into the p-type well 3 on both sides of the gate electrode 7 to form n$^-$-type semiconductor regions 11, p-type impurities (boron ions) are injected into the n-type well 4 to form p$^-$-type semiconductor regions 12.

Figure 4:
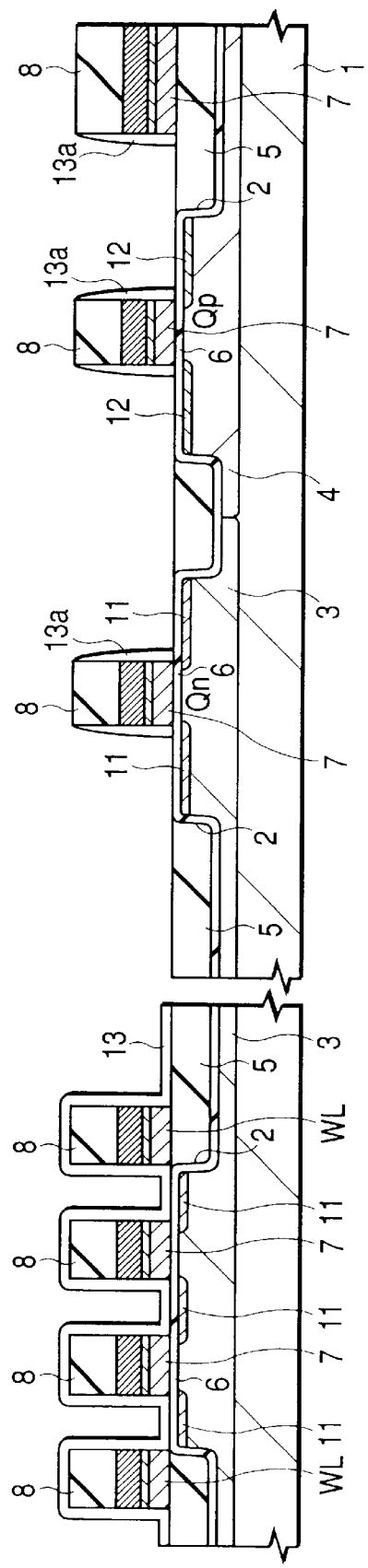
FIG. 4 is a sectional view illustrating a major portion of the semiconductor substrate to explain the fabrication method for semiconductor integrated circuit devices according to the embodiment of the invention.

Referring next to FIG. 4, a silicon nitride film 13 is deposited maintaining a thickness of about 50 nm on the substrate 1 by the CVD method, the upper part of the substrate 1 of the memory region is covered with a photoresist film (not shown), and the silicon nitride film 13 on the logic region is anisotropically etched to form side wall spacers 13a on the side walls of the gate electrode 7 of the logic region.

Referring next to FIG. 5, the n-type well 4 in the logic region and the memory region are covered with a photoresist film 9, and n-type impurities (arsenic ions) are injected into the p-type well 3 in the logic region. Then, as shown in FIG. 6, the p-type well 3 in the logic region and the memory region are covered with a photoresist film 10, and p-type impurities (boron ions) are injected into the n-type well 4 in the logic region. The n-type impurities and p-type impurities are injected to a depth of not larger than 100 nm, desirably, not larger than 50 nm and, more desirably, not larger than 20 nm.

Next, in order to activate the n-type impurities and p-type impurities introduced into the substrate 1, the substrate (wafer) 1 is annealed by using an annealing device which is described below.

Figure 7:
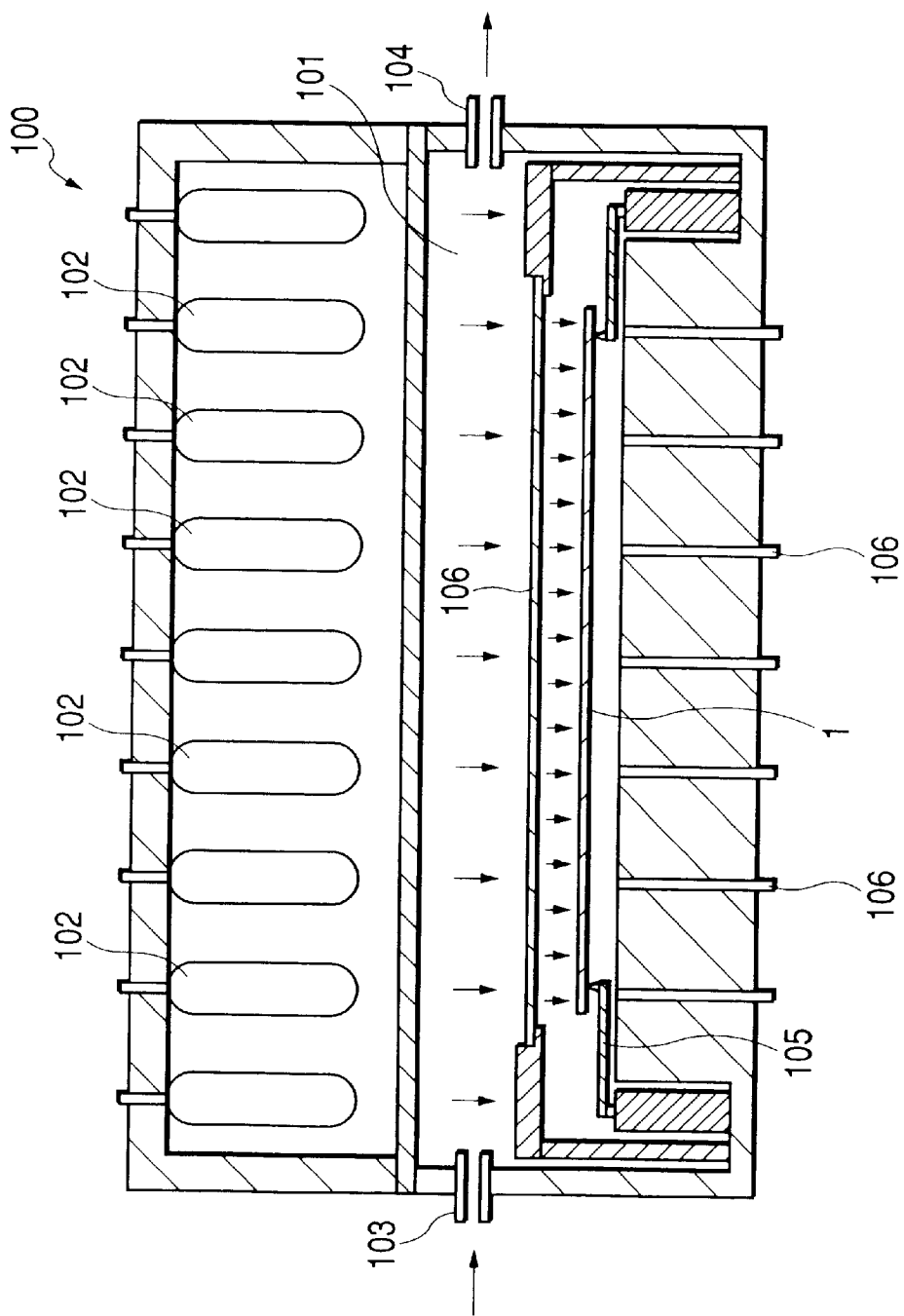
FIG. 7 is a view schematically illustrating the constitution of a piece-by-piece type annealing device used in the embodiment of the invention.
Figure 8:
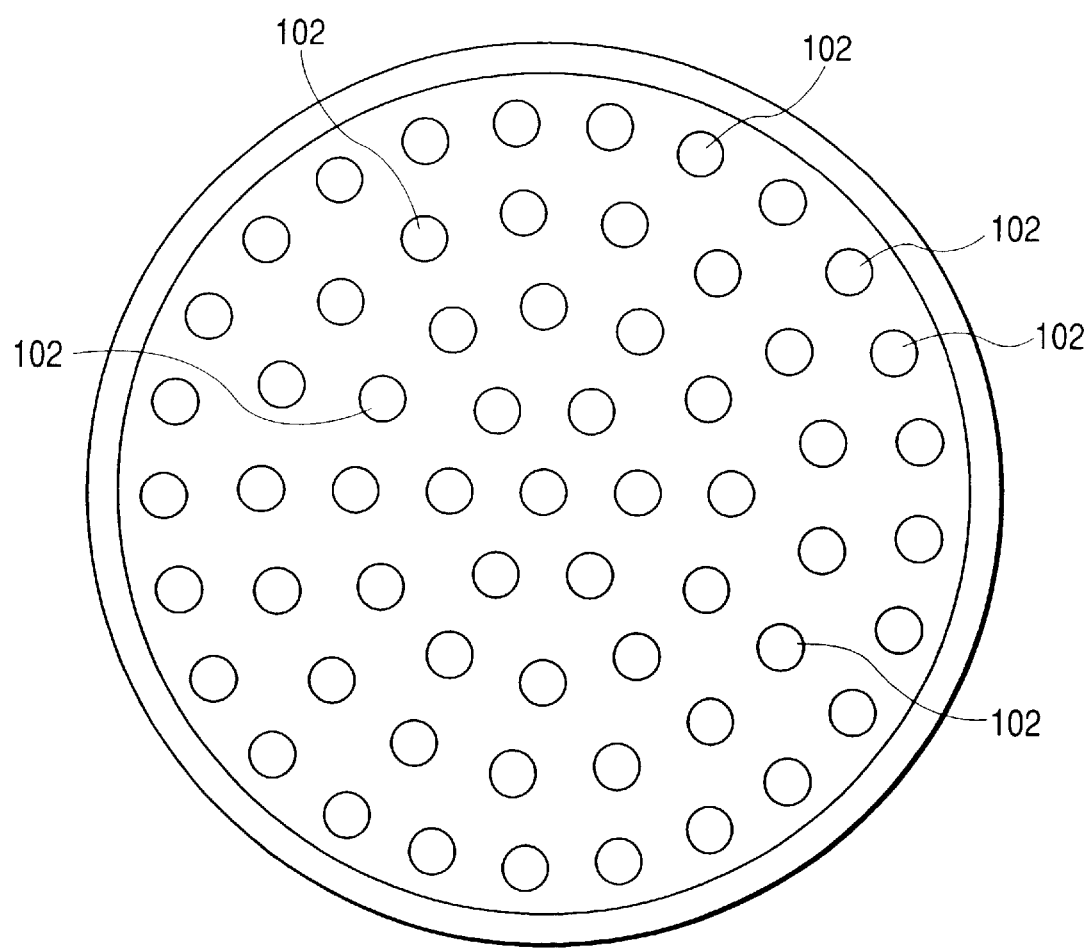
FIG. 8 is a plan view illustrating the arrangement of lamps in the annealing device shown in FIG. 7.

FIG. 7 is a view schematically illustrating the constitution of a piece-by-piece type annealing device used in this embodiment. This annealing device 100 includes a chamber 101 having an outer wall constituted by a metal such as a stainless steel (SUS) or quartz, and a plurality of lamps 102 which are heat sources for the wafer 1 are arranged in the upper part of the chamber 101. These lamps 102 are W (tungsten)-halogen lamps of a diameter of 30 mm emitting light of a wavelength of about 1 $\mu$m which is highly efficiently absorbed by silicon, and are densely arranged describing a concentric pattern as shown in, for example, FIG. 8. The outermost circumference of the concentric circles has a diameter of about 300 mm.

To the wall surface of the chamber 101 are connected a gas introduction pipe 103 for introducing nitrogen gas into the chamber 101 and an exhaust pipe 104 for draining the gas introduced into the chamber 101. Further, a susceptor 105 is provided at the center in the chamber 101 for holding the wafer 1. The wafer 1 is horizontally held by the upper surface of the susceptor 105 with its main surface (device surface) being faced upward. As an example, the wafer 1 has a size of a diameter of 200 mm and a thickness of 725 $\mu$m.

Figure 9:
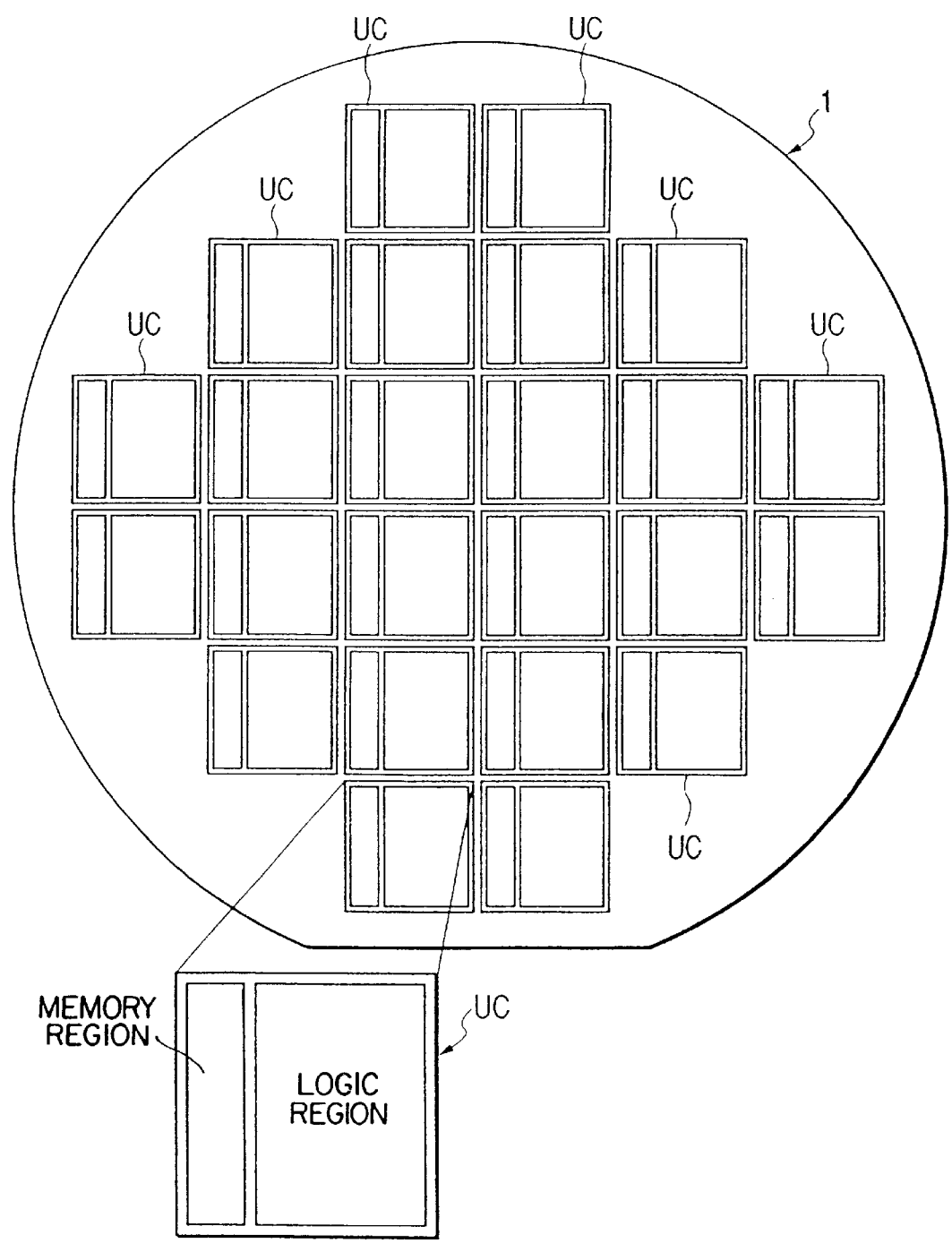
FIG. 9 is a plan view illustrating the whole main surface of a wafer.

FIG. 9 is a plan view illustrating the main surface of the wafer 1 held on the upper surface of the susceptor 105. As shown, a plurality of unit chip regions UC having a rectangular pattern are formed in the form of a matrix on the chip-forming unit on the main surface of the wafer 1. Each of these unit chip regions UC becomes a single chip when the wafer 1, after the wafer process has been completed, is divided by dicing. The unit chip region UC has a size of about 20 mm long and about 20 mm wide.

Each unit chip region UC formed on the main surface of the wafer 1 has a memory region and a logic region. The area ratio of the memory region and the logic region in the unit chip region UC, i.e., the hybrid ratio of the two, is, for example, not smaller than 15%, not smaller than 20% or not smaller than 25% though it may vary depending upon the products. Here, the hybrid ratio stands for a ratio (percentage) of the area of the memory region to the total areas of the memory region and of the logic region. In the case of the unit chip region UC shown, for example, the hybrid ratio becomes 15% when the ratio of short sides of the memory region and the logic region is 3:17. Similarly, the hybrid ratio becomes 20% when the ratio of short sides of the memory region and the logic region is 1:4 and becomes 25% when the ratio is 1:3.

In general, the memory region has elements that are highly densely arranged to increase the memory capacity as much as possible, and has a higher pattern density than that of the logic region (see also FIGS. 2 to 6). The memory region referred to here stands for a high-density memory cell array of a random access memory having a pattern density higher than that of the logic region, such as a DRAM, SRAM (static random access memory, FeRAM (ferroelectric random access memory) and flush memory, as well as peripheral circuits thereof.

A light-shielding plate 106 is installed over the susceptor 105 that holds the wafer 1 close to and opposed to the device surface (main surface) of the wafer 1. The light-shielding plate 106 is a circular plate constituted by heat-resistant ceramics such as Sic (silicon carbide) and is usually installed with its main surface (upper surface and lower surface) being nearly in parallel with the main surface of the wafer 1. Further, pyrometers 107 are installed under the wafer 1 to measure the temperature of the wafer 1 at a multiplicity of points.

The light-shielding plate 106 has a thickness (SiC heat capacity converted thickness) of about 500 $\mu$m and a diameter of about 225 mm when the wafer 1 has a diameter of 200 mm. The gap is about 7 mm between the lower surface of the light-shielding plate 106 and the main surface of the wafer 1, and the distance is about 60 mm from the upper surface of the light-shielding plate 106 to the lamps 102.

When the lamps 102 are turned on in a state where the light-shielding plate 106 is interposed between the lamps 102 and the wafer 1 as described above, the light-shielding plate 106, first, absorbs light from the lamps 102 and is heated. Then, the wafer 1 is heated while absorbing light radiated from the light-shielding plate 106. The light-shielding plate 106 made of ceramics such as SiC, when regarded as a heat-generating body, exhibits flat emissivity irrespective of the wavelengths and radiates light (heat rays) over a wide band of wavelengths. Therefore, when the wafer 1 is heated by radiant heat from the light-shielding plate 106, the temperature is elevated for a short period of time (temperature-elevating rate is high) compared to when it is directly heated by light from the lamps 102 that radiates light with a wavelength of about 1 $\mu$m. The material which exhibits flat emissivity irrespective of the wavelengths like SiC has a function to smoothly re-distribute the light of short wavelengths into the exciting state of a wide range, and exhibits uniformly radiating characteristics like a black body or a gray body.

On the other hand, the silicon wafer used for the manufacture of ULSIs is nearly opaque to light from the visible zone to about 1.2 $\mu$m at lower than 600° C., i.e., at a low temperature zone (particularly, at lower than 500° C., this tendency appears more conspicuously in a low-temp electrons erature zone of a narrow band) due to inter-band transition of electrons, and exhibits a relatively high absorbency in a region of a wavelength of longer than 6 $\mu$m due to lattice oscillation. In the intermediate region between them, the silicon wafer exhibits a relatively weak absorbency due to free electrons. At temperatures of not lower than 600° C., the silicon becomes opaque over almost all of these regions. Therefore, the wafer having a uniform surface exhibits emissivity that varies very little depending on the wavelengths.

Further, upon irradiating the wafer 1 with light at of wavelengths over a wide range, it is possible to eliminate dispersion in the emissivity caused by the density of the integrated circuit pattern formed on the main surface of the wafer 1. Accordingly, not only the temperature distribution on the wafer 1 simply becomes uniform over the whole chip-forming portion but also local dispersion in the temperature is eliminated in the unit chip region UC that is caused by the density of the patterns and, hence, the temperature distribution in the unit chip region UC becomes uniform in both the memory region and the logic region.

To irradiate the whole chip-forming portion of the wafer 1 with radiant rays of nearly equal amount of energy, the area of the light-shielding plate 106 must at least be larger than the area of the chip-forming portion of the wafer 1. It is further desired that both surfaces of the light-shielding plate 106 are optically uniform, i.e., have less coarseness in the pattern that causes dispersion in the reflection factor and less dispersion in the surface shape such as presence of pattern than those of the device surface of the wafer 1. In particular, it is desired that the lower surface of the light-shielding plate 106 opposed to the main surface of the wafer 1 has an average reflection factor lower than that of the device surface of the wafer 1.

In general, further, the energy efficiency varies in inverse proportion to the square power of the distance from the heat source. Therefore, the rate of elevating the temperature of the wafer 1 decreases when the gap from the light-shielding plate 106 is too large. In particular, when shallow diffusion layers (source, drain) are to be formed while suppressing the diffusion of impurities, it is desired that the rate of elevating the temperature of the wafer 1 is at least not smaller than 30° C./sec. and preferably not smaller than 50° C./sec. Therefore, the gap between the lower surface of the light-shielding plate 1 and the device surface of the wafer 1 is set to be not larger than 20 times the thickness of the wafer 1, desirably, not larger than 10 times thereof, and more desirably, not larger than 5 times thereof. Further, even when the light-shielding plate 106 has a large thickness, the rate for elevating the temperature of the wafer 1 decreases. Therefore, the thickness of the light-shielding plate 106 is not larger than 3 times the thickness of the wafer 1 at the greatest and is, preferably, not larger than 2 times thereof and, more preferably, not larger than the thickness of the wafer 1.

The material constituting the light-shielding plate 106 is not limited to SiC but may be single crystalline silicon, amorphous or polycrystalline silicon or heat-resistant ceramics having a relatively uniform surface texture. In this case, too, it is desired that the thickness of the light-shielding plate 106 has the above-mentioned value in terms of the SiC heat capacity converted thickness.

Figure 10:
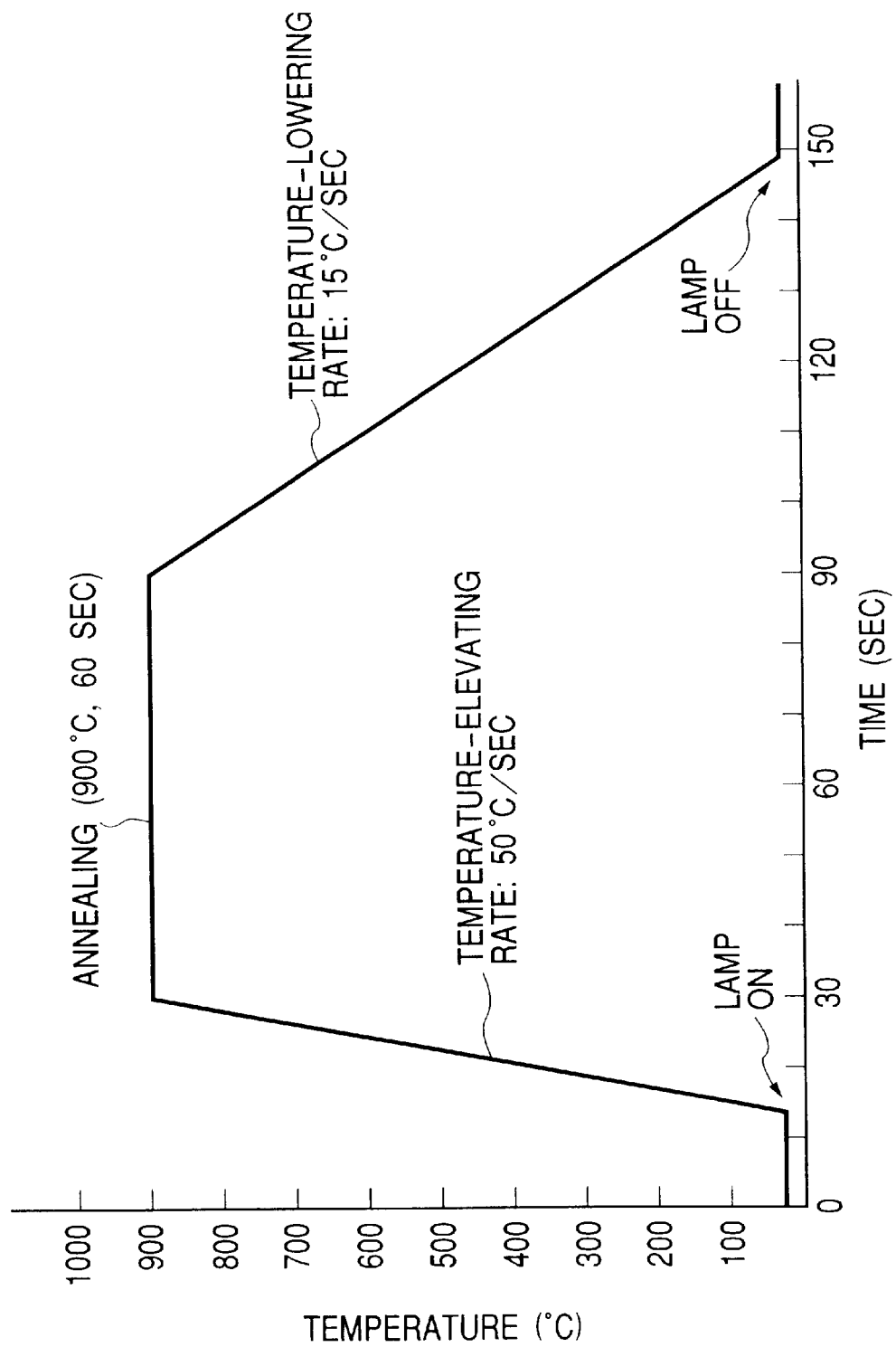
FIG. 10 is a time diagram illustrating an annealing sequence using the annealing device shown in FIG. 7.

FIG. 10 illustrates an example of an annealing sequence using the annealing device 100. In this example, the wafer 1 is loaded on the susceptor 105 while introducing a nitrogen gas into the chamber 101 to replace the gas in the chamber 101 to a sufficient degree and, then, the lamps 102 are turned on to heat the light-shielding plate 106 and to heat the wafer 1 by heat radiated from the light-shielding plate 106 that is heated. The wafer is heated at a temperature-elevating rate of 50° C./sec., annealed at 900° C. for 60 seconds, and is cooled at a temperature-lowering rate of 15° C./sec.

The impurities are activated by annealing, $n^+$-type semiconductor regions 14 (source and drain) are formed in the p-type well 3 of the logic region, and $p^+$-type semiconductor regions 15 (source and drain) are formed in the n-type well 4 as shown in FIG. 11. The junction depth of the $n^+$-type semiconductor regions 14 and of the $p^+$-type semiconductor regions 15 is not larger than 120 nm, preferably, not larger than 60 nm and, more preferably, not larger than 24 nm.

An n-channel MISFET Qn and a p-channel MISFET Qp are formed in the logic region up to this step. In this embodiment in this case, the annealing temperature is uniformalized between the central portion and the peripheral portion of the wafer 1, and between the memory region and the logic region in the unit chip region UC. Accordingly, the sheet resistances of the source and drain are uniformalized in the wafer surface. Besides, the temperature-elevating rate is great as compared to when an existing lamp annealing device is used and, hence, the impurities are suppressed from diffusing, making it possible to form shallow pn junctions (source and drain).

Referring next to FIG. 12, a silicon oxide film 16 is deposited maintaining a thickness of about 600 nm on the substrate 1 by the CVD method. Then, the surface is flattened by the chemical mechanical polishing method, and the silicon oxide film 16 on the memory region and the underlying silicon nitride film 13 are dry-etched using the photoresist film (not shown) as a mask thereby to form contact holes 18, 19 in the upper part of the $n^-$-type semiconductor region 11.

The insulating film covering the upper part of the MISFETs (Qn, Qp, Qs) may be an SOG (spin-on-glass) film instead of the silicon oxide film 16. The SOG film exhibits excellent property for filling gaps among fine wirings compared with the silicon oxide film 16 deposited by the CVD method. Therefore, even the very narrow space of the gate electrode 7 (word line WL) in the memory region can be favorably buried. As the SOG film, there can be used a film comprising hydrogen silsesquioxane as a chief component and the one comprising polysilazane as a chief component.

When the SOG film is used, a solution of SOG diluted with a solvent is applied by spin-coating onto the substrate 1 and, then, the solvent is vaporized by annealing at about 400° C., followed by annealing in an oxygen-containing atmosphere at about 800° C. for one minute to make the SOG film dense. Here, by using the annealing device 100 equipped with the light-shielding plate 106, the temperature of the wafer (substrate) 1 is elevated at an increased rate suppressing the diffusion of impurities introduced into the source and drain of the MISFET.

Thereafter, the SOG film is chemically and mechanically polished to flatten the surface and, then, contact holes 18, 19 are formed in the upper part of the $n^-$-type semiconductor region 11 by the same method as the one described above. Generally, the SOG film obtained by the heat treatment at about 400° C. is softer than the silicon oxide film deposited by the CVD method and cannot be chemically and mechanically polished. However, the SOG film which is made dense by annealing at a temperature as high as about 800° C. has a density equivalent to, or higher than, that of the silicon oxide film deposited by the CVD method, and can be flattened by the chemical and mechanical polishing.

Figure 13:
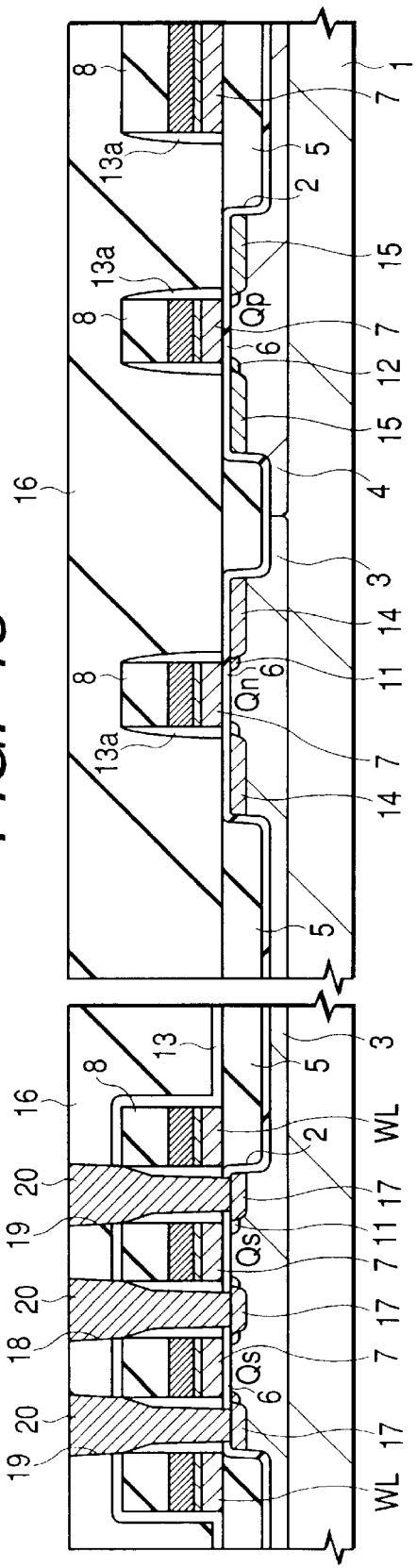
FIG. 13 is a sectional view illustrating a major portion of the semiconductor substrate to explain the fabrication method for semiconductor integrated circuit devices according to the embodiment of the invention.

Referring next to FIG. 13, a plug 20 is formed in the contact holes 18 and 19. To form the plug 20, the interiors of the contact holes 18 and 19 are wet-cleaned with a washing solution containing hydrofluoric acid and, then, a low-resistance polycrystalline silicon film doped with n-type impurities such as phosphorus (P) is deposited inside the contact holes 18, 19 and on the silicon oxide film 16 by the CVD method. Then, the polycrystalline silicon film is etched back (or polished by the chemical mechanical polishing method) so as to be left inside the contact holes 18, 19 only.

Next, the annealing is effected in a nitrogen gas atmosphere at about 800° C. for one minute, and the n-type impurities in the polycrystalline silicon film constituting the plug 20 are diffused in the substrate 1 (p-type well 3) at the bottom of the contact holes 18, 19 thereby to form $n^+$-type semiconductor regions 17 (source and drain) in the memory region. A MISFET Qs for selecting a memory cell is formed in the memory region up to this step. It is desired that the annealing for forming the $n^+$-type semiconductor regions 17 (source and drain) is effected by using the annealing device 100 equipped with the light-shielding plate 106.

Figure 14:
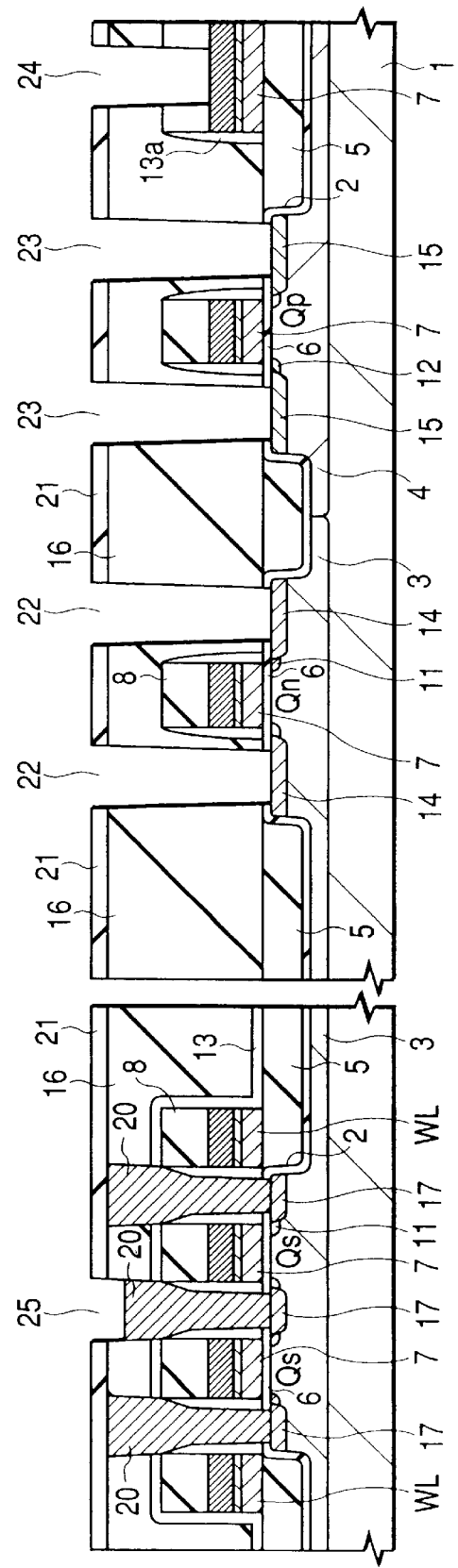
FIG. 14 is a sectional view illustrating a major portion of the semiconductor substrate to explain the fabrication method for semiconductor integrated circuit devices according to the embodiment of the invention.

Referring next to FIG. 14, a silicon oxide film 21 is deposited maintaining a thickness of about 20 nm on the silicon oxide film 16 by the CVD method and, then, the silicon oxide film 21 and the underlying silicon oxide film 16 in the logic region are dry-etched using a photoresist film (not shown) as a mask, thereby to form contact holes 22 in the upper part of the source and drain ($n^+$-type semiconductor regions 14) of the n-channel MISFET Qn and to form contact holes 23 in the upper part of the source and drain ($p^+$-type semiconductor regions 15) of the p-channel MISFET Qp. At the same time, a contact hole 24 is formed in the upper part of the gate electrode 7 of the p-channel MISFET $Q_p$ (and of the gate electrode 7 of a region that is not shown of the n-channel MISFET Qn) in the logic region, and a through hole 25 is formed in the upper part of the contact hole 18 in the memory region.

Figure 15:
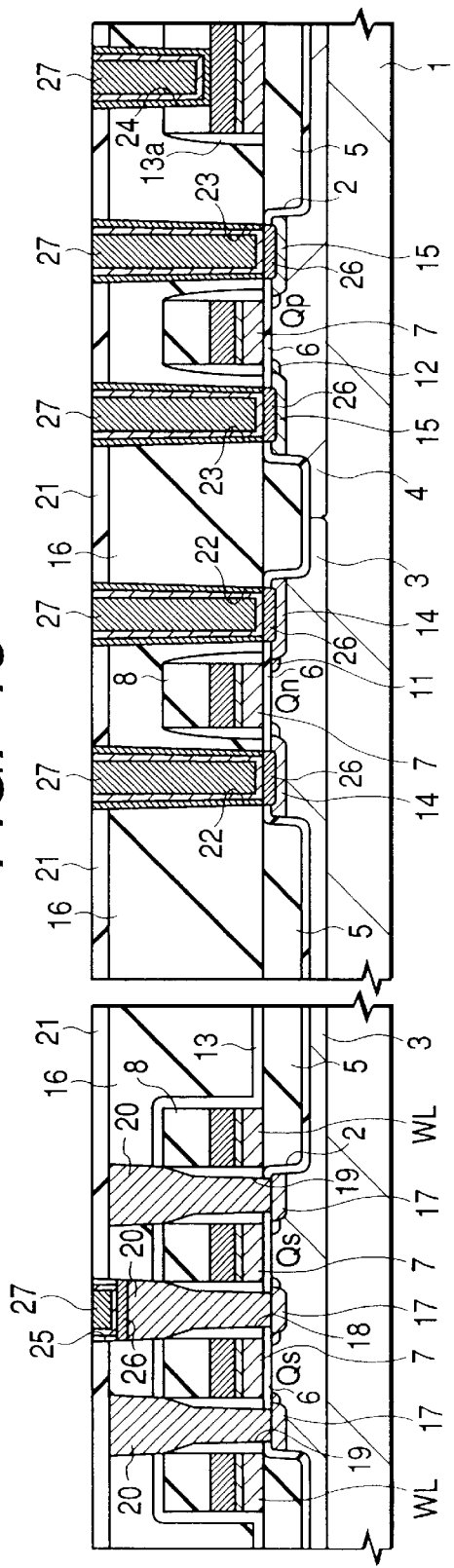
FIG. 15 is a sectional view illustrating a major portion of the semiconductor substrate to explain the fabrication method for semiconductor integrated circuit devices according to the embodiment of the invention.

Referring next to FIG. 15, a silicide layer 26 is formed on the surfaces of the source and drain ($n^+$-type semiconductor regions 14) of the n-channel MISFET Qn, on the surfaces of the source and drain ($p^+$-type semiconductor regions 15) of the p-channel MISFET Qp, and on the surface of the plug 20 in the contact hole 18 and, then, plugs 27 are formed in the contact holes 22, 23, 24 and in the through hole 25.

A silicide layer 26 is formed on the interface between the source and drain ($n^+$-type semiconductor regions 14, $p^+$-type semiconductor regions 15) and the plugs 27 are formed thereon. Therefore, the contact resistance decreases between the source, drain ($n^+$-type semiconductor regions 14, $p^+$-type semiconductor regions 15) and the plugs 27, and MISFETs (n-channel MISFET Qn, p-channel MISFET Qp) constituting the logic circuit operate at high speeds.

To form the silicide film 26, a Ti film (or Co film) is deposited maintaining a thickness of about 30 nm and a TiN film is deposited maintaining a thickness of about 20 nm by sputtering on the silicon oxide film 21 inclusive of the interiors of the contact holes 22, 23, 24 and interior of the through hole 25 and, then, the substrate 1 is annealed. It is desired that the annealing is effected within a short period of time by using an annealing device 100 equipped with the light-shielding plate 106. Further, the plugs 27 are formed by depositing a TiN film maintaining a thickness of about 50 nm and a w film maintaining a thickness of about 300 nm by the CVD method on the above TiN film inclusive of the interiors of the contact holes 22, 23, 24 and interior of the through hole 25 and, then, the W film, TiN film and Ti film on the silicon oxide film 21 are removed by the chemical mechanical polishing.

Figure 16:
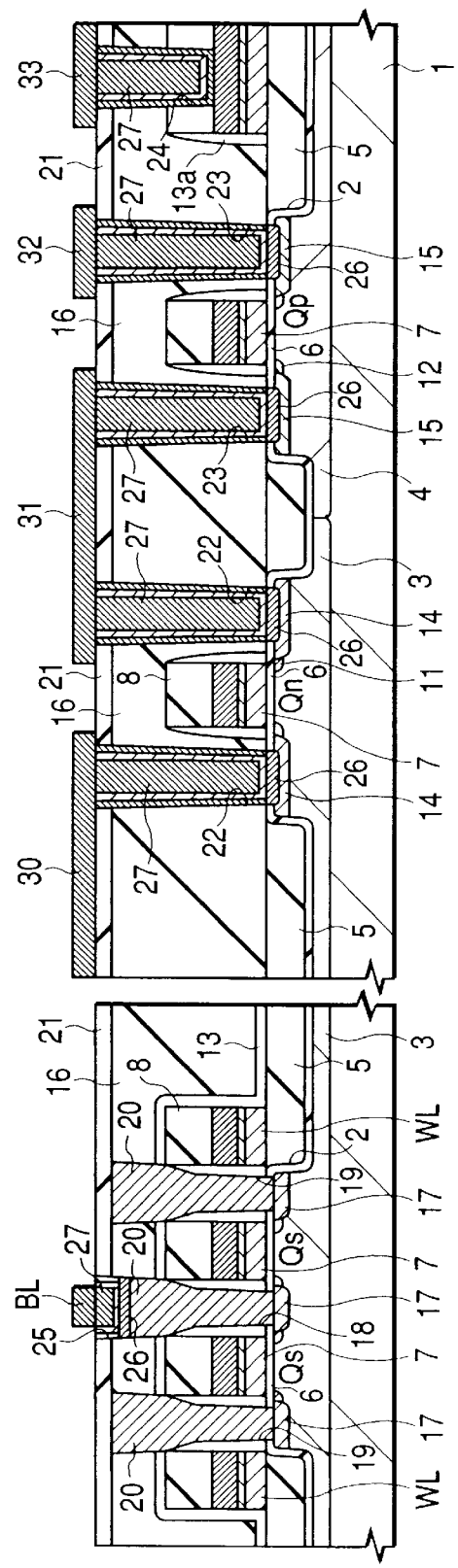
FIG. 16 is a sectional view illustrating a major portion of the semiconductor substrate to explain the fabrication method for semiconductor integrated circuit devices according to the embodiment of the invention.

Referring next to FIG. 16, a bit line BL is formed on the silicon oxide film 21 in the memory region, and wirings 30 to 33 of a first layer are formed on the silicon oxide film 21 on the logic region. To form the bit line BL and the wirings 30 to 33 of the first layer, the W film is deposited maintaining a thickness of about 100 nm by sputtering on, for example, the silicon oxide film 21 and, then, the W film is dry-etched by using the photoresist film as a mask.

Figure 17:
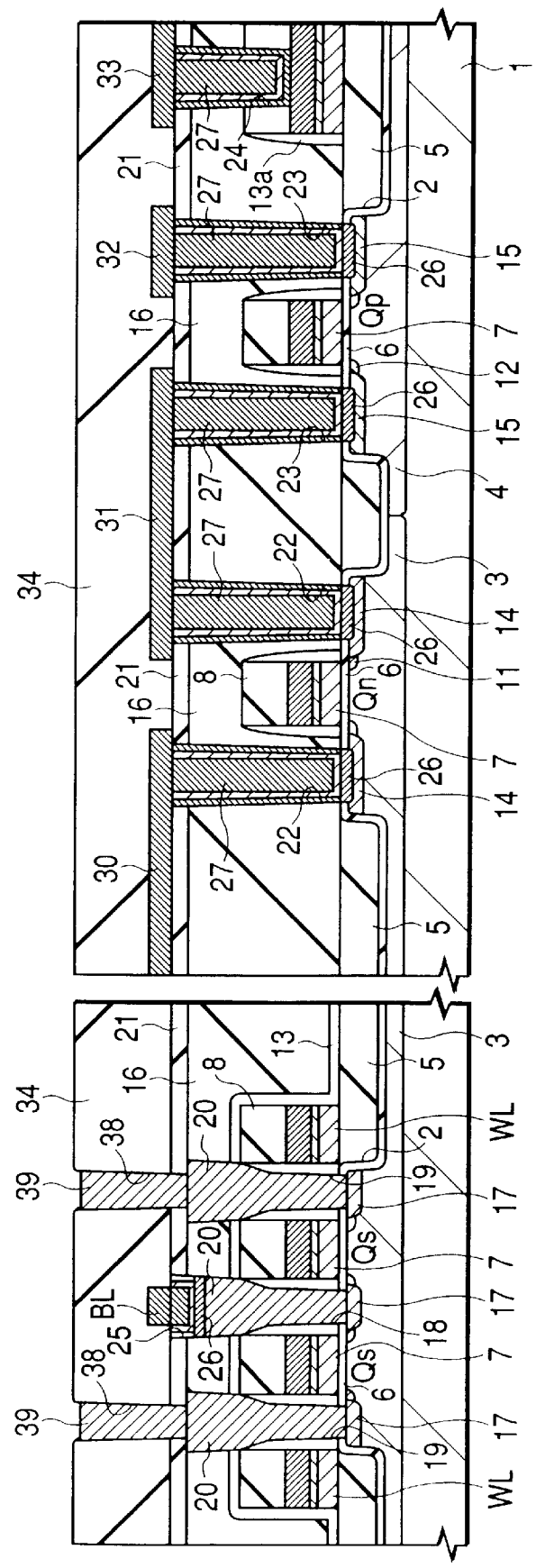
FIG. 17 is a sectional view illustrating a major portion of the semiconductor substrate to explain the fabrication method for semiconductor integrated circuit devices according to the embodiment of the invention.

Referring next to FIG. 17, a silicon oxide film 34 is formed while maintaining a thickness of about 300 nm on the bit line BL in the memory region and on the wirings 30 to 33 of the first layer in the logic region. Then, the silicon oxide film 34 of the memory region is dry-etched by using the photoresist film (not shown) as a mask in order to form a through hole 38 in the upper part of the contact hole 19.

Next, the plug 39 is formed in the through hole 38. To form the plug 39, a low-resistance polycrystalline silicon film doped with n-type impurities (phosphorus) is deposited by the CVD method in the through hole 38 and on the silicon oxide film 34 and, then, the polycrystalline silicon film on the silicon oxide film 34 is removed by etching back.

Figure 18:
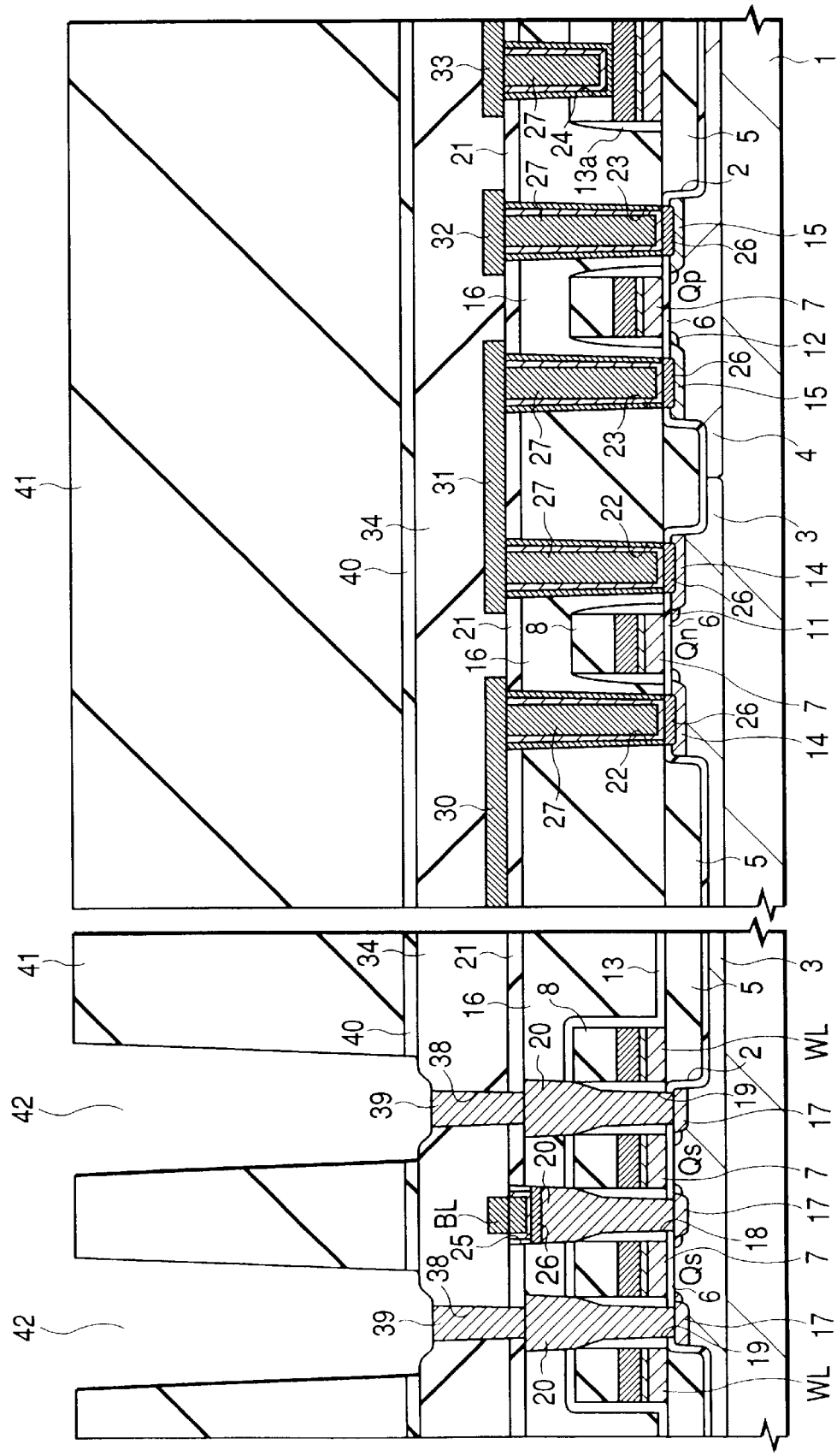
FIG. 18 is a sectional view illustrating a major portion of the semiconductor substrate to explain the fabrication method for semiconductor integrated circuit devices according to the embodiment of the invention.

Referring next to FIG. 18, a silicon nitride film 40 is deposited while maintaining a thickness of about 100 nm by the CVD method on the silicon oxide film 34 and, then, a silicon oxide film 41 is deposited by the CVD method on the silicon nitride film 40. Thereafter, the silicon oxide film 41 in the memory region is dry-etched by using a photoresist film (not shown) as a mask, and the silicon nitride film 40 under the silicon oxide film 41 is dry-etched to form a groove 42 in the upper part of the through hole 38. The lower electrode of the capacitor element for storing data is formed along the inner wall of the groove 42. To increase the electric charge by increasing the surface area of the lower electrode, therefore, the silicon oxide film 41 for forming the groove 42 is thickly deposited (e.g., about 1.3 $\mu$m).

Figure 19:
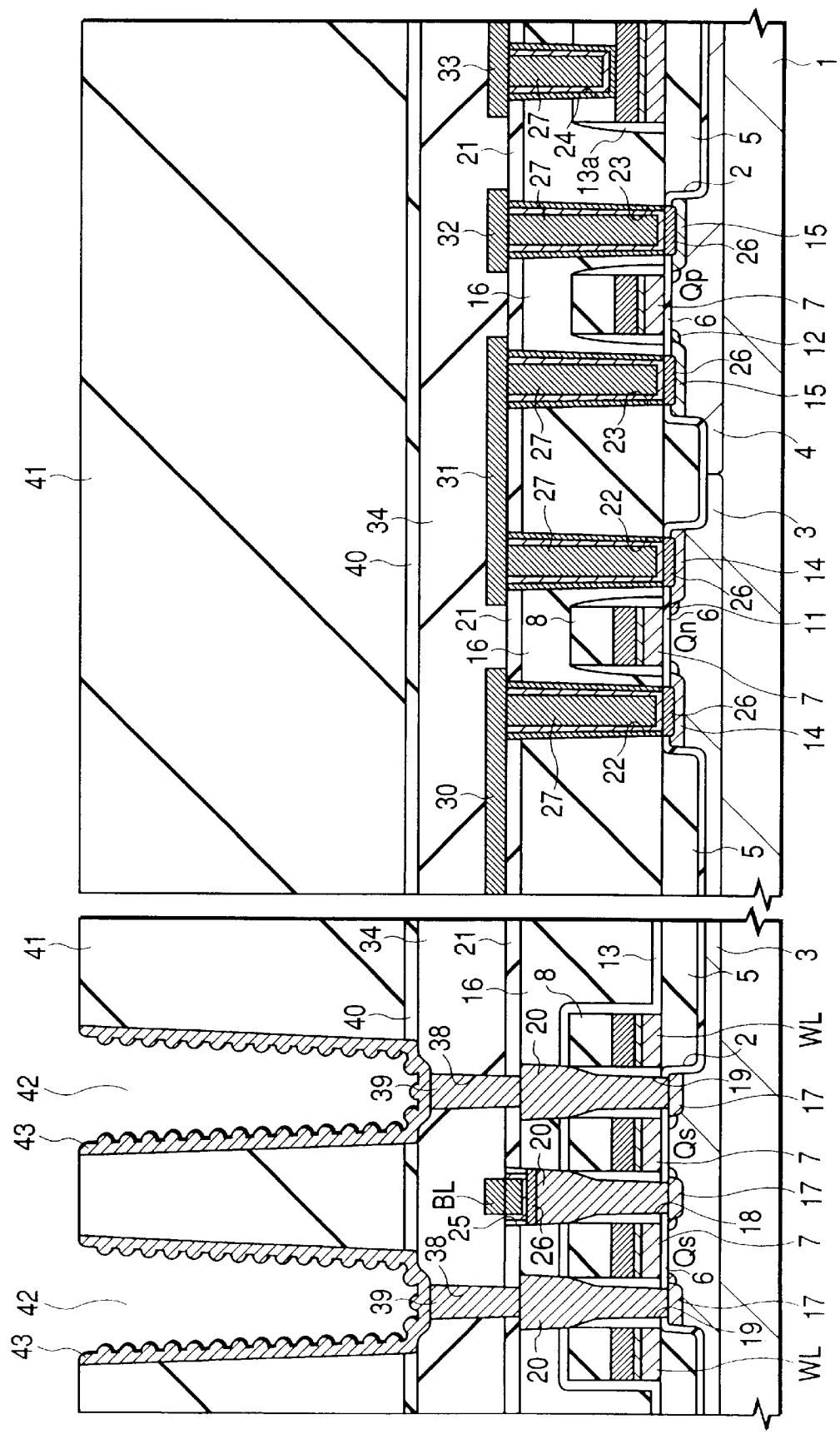
FIG. 19 is a sectional view illustrating a major portion of the semiconductor substrate to explain the fabrication method for semiconductor integrated circuit devices according to the embodiment of the invention.

Referring next to FIG. 19, a polycrystalline silicon film 43 is formed along the inner walls of the grooves 42 so as to be used as a lower electrode of the capacitor element for storing data. To form the polycrystalline silicon film 43, first, an amorphous silicon film (not shown) doped with n-type impurities (phosphorus) is deposited while maintaining a thickness of about 50 nm by the CVD method in the grooves 42 and on the silicon oxide film 41. Then, the amorphous silicon film on the silicon oxide film 41 is etched back so as to remain on the inner walls of the grooves 42.

Next, the surface of the amorphous silicon film remaining in the grooves 42 is wet-washed with a washing solution of the type of hydrofluoric acid and, then, monosilane ($SiH_4$) is fed onto the surface of the amorphous silicon film in a reduced-pressure atmosphere. The substrate 1 is then heat-treated to polycrystallize the amorphous silicon film and to grow silicon particles on the surface thereof. Thus, the polycrystalline silicon film 43 having a coarse surface is formed along the inner walls of the grooves 42. The polycrystalline silicon film 43 has a coarse surface and a large surface area, making it possible to increase the amount of electric charge stored in the capacitor element for storing data.

Figure 20:
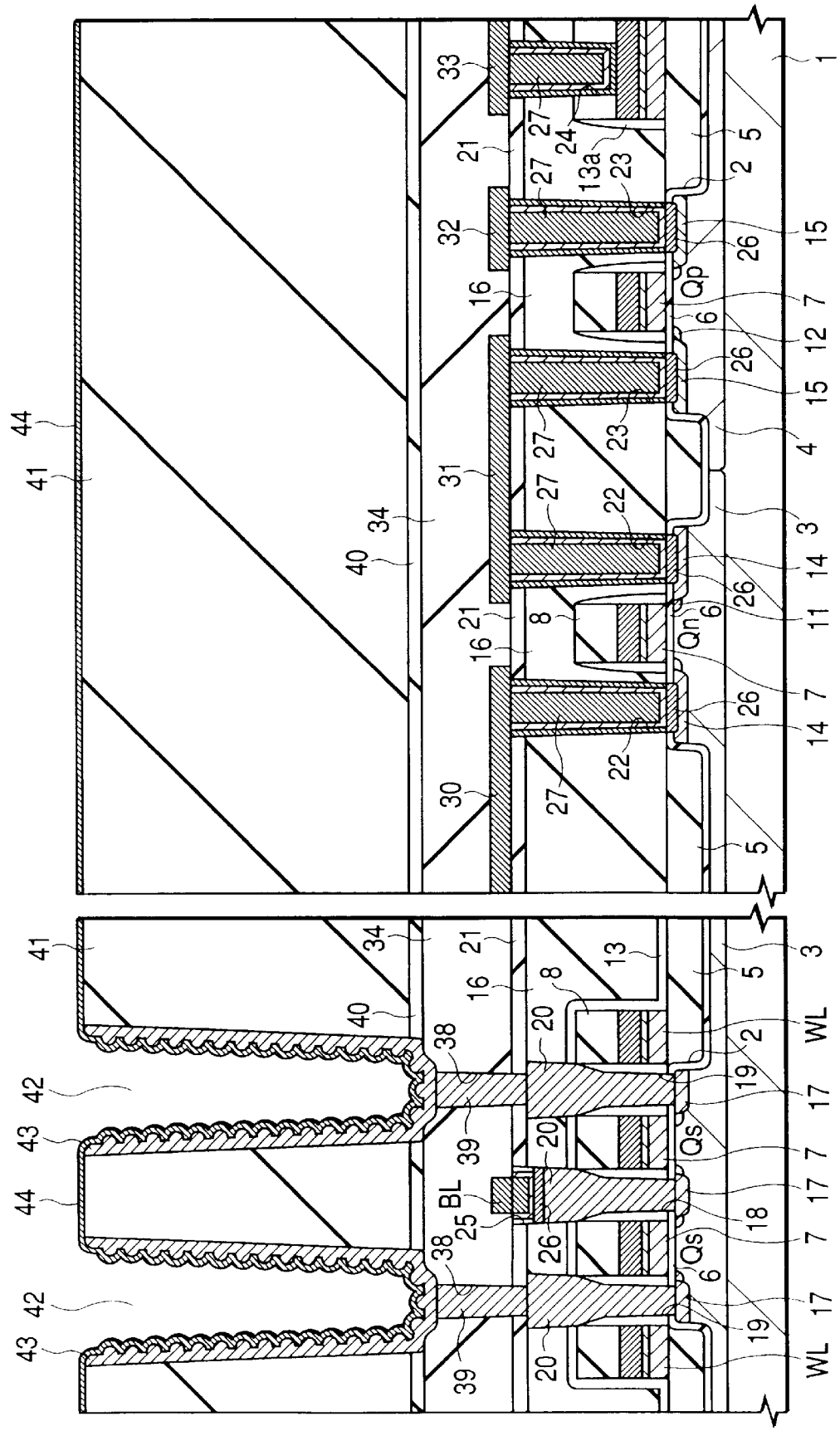
FIG. 20 is a sectional view illustrating a major portion of the semiconductor substrate to explain the fabrication method for semiconductor integrated circuit devices according to the embodiment of the invention.

Referring next to FIG. 20, a tantalum oxide ($Ta_2O_5$) film 44 is deposited while maintaining a thickness of from about 10 to about 15 nm by the CVD method on the surface of the polycrystalline silicon film 43 formed in the grooves 42 and on the surface of the silicon oxide film 41 formed on the outside of the grooves 42. The tantalum oxide film 44 is used as a capacitor insulating film for the capacitor element for storing data.

Next, the substrate 1 is annealed in an oxygen atmosphere to reform/crystallize the tantalum oxide film 44. Upon effecting the annealing, there is obtained a tantalum oxide film 44 of a high quality having a dielectric constant of as high as from 20 to 25 and permitting a little current to leak. By forming the capacitor insulating film of the capacitor element for storing data using an insulating film having a high dielectric constant, it is possible to increase the amount of electric charge stored in the capacitor element for storing data.

The annealing for reforming/crystallizing the tantalum oxide film 44 is executed in an oxygen atmosphere over a temperature range of from 600° C. to 800° C. From the standpoint of suppressing the diffusion of impurities introduced into the source and drain of the MISFET, it is desired that the annealing is executed within a short period of time of not longer than 5 minutes. Therefore, the annealing is effected at a temperature-elevating rate of not smaller than 20° C./sec, by using the annealing device 100 equipped with the light-shielding plate 106. In this case, the gap between the lower surface of the light-shielding plate 1 and the device surface of the wafer 1 is not larger than 20 times the thickness of the wafer 1, preferably, not larger than 10 times thereof and, more preferably, not larger than 5 times thereof. Further, the thickness of the light-shielding plate 106 is not larger than three times the thickness of the wafer 1 at the greatest, preferably, not larger than two times thereof and, more preferably, not larger than the thickness of the wafer 1 in terms of the SiC heat capacity converted thickness.

By using the annealing device 100 equipped with the light-shielding plate 106 for annealing the tantalum oxide film 44, not only a high temperature-elevating rate is obtained but also the temperature distribution of the wafer 1 is uniformalized on the whole chip-forming portion, making it possible to decrease dispersion in the characteristics of the tantalum oxide film 44 between the central portion and the peripheral portion of the wafer 1. When the existing lamp annealing device is used, further, there occurs a difference in the temperature of the wafer between the central portion and the peripheral portion (region close to the logic region) of the memory region due to a difference in the emissivity caused by the density of the integrated circuit pattern even in the unit chip region UC. By using the annealing device 100 equipped with the light-shielding plate 106, however, this problem can be avoided to decrease the dispersion in the characteristics of the tantalum oxide film 44 between the central portion and the peripheral portion of the memory region.

The capacitor insulating film of the capacitor element for storing data is not limited to the above tantalum oxide film 44 only but may be constituted by a film comprising chiefly a highly dielectric material or a ferroelectric material having a crystal structure of a perovskite type or a composite perovskite type, such as PZT, PLT, PLZT, $PbTiO_3$, $SrTiO_3$, $BaTiO_3$, BST, SBT or $Ta_2O_5$. When the highly dielectric film or the ferroelectric film is used, too, the annealing must be effected to reform/crystallize the film. Use of the annealing device 100 equipped with the light-shielding plate 106 decreases the dispersion in the characteristics.

When the capacitor insulating film of the capacitor element for storing data is formed of a highly dielectric material or a ferroelectric material having a crystal structure of the perovskite type or of the composite perovskite type, it is desired that the electrode of the capacitor element for storing data is constituted by a metal of the platinum group having a high antioxidizing property, such as Pt, Ru, Ir or the like.

Figure 21:
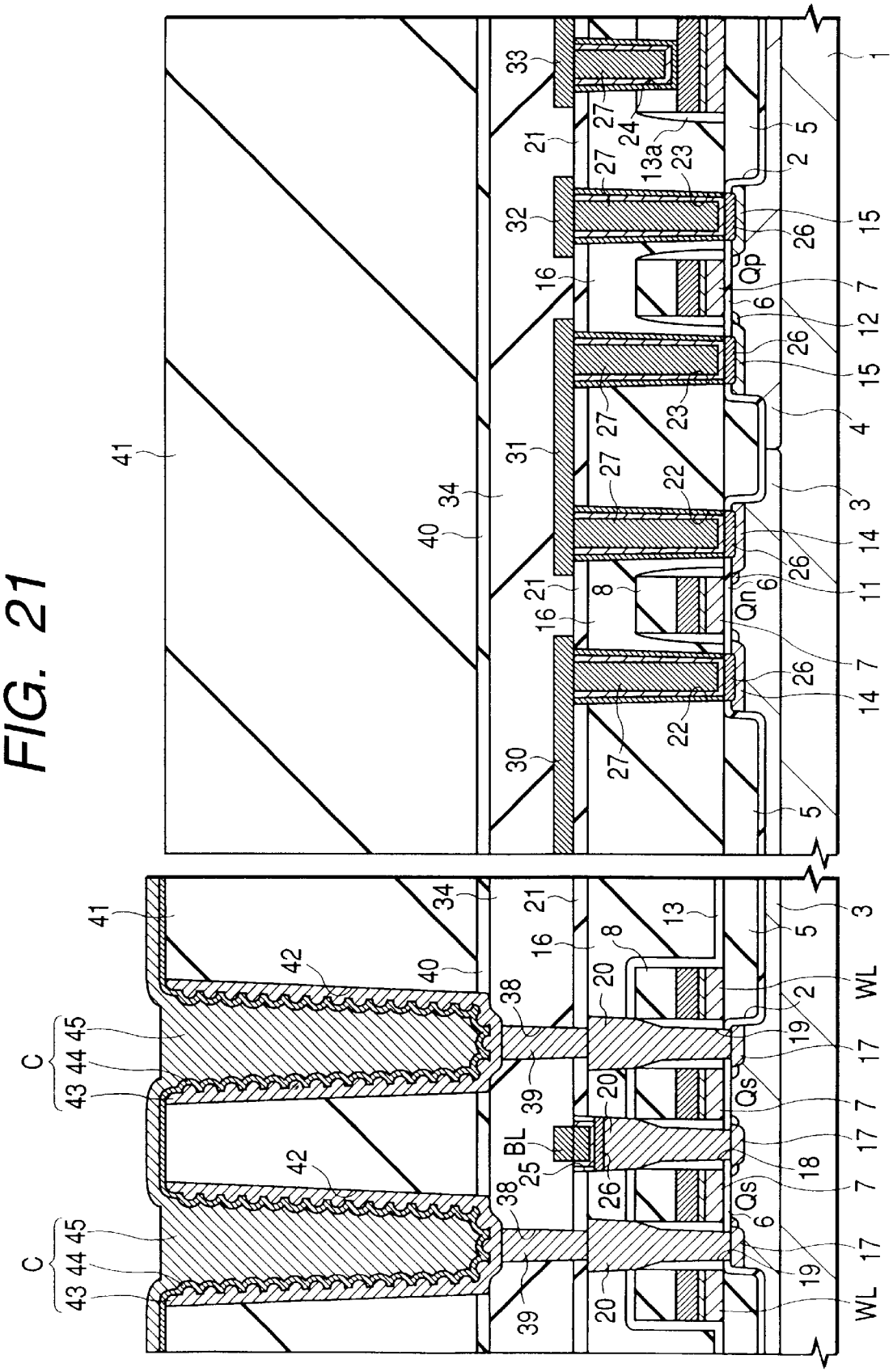
FIG. 21 is a sectional view illustrating a major portion of the semiconductor substrate to explain the fabrication method for semiconductor integrated circuit devices according to the embodiment of the invention.

Referring next to FIG. 21, a TiN film 45 is deposited while maintaining a thickness of about 150 nm by the CVD method and sputtering method on the tantalum oxide film 44 inclusive of the interiors of the grooves 42, and the TiN film 45 and the tantalum oxide film 44 are patterned by dry-etching using a photoresist film (not shown) as a mask. There is thus formed a capacitor element C for storing data being constituted by the upper electrode of TiN film 45, capacitor insulating film of tantalum oxide film 44 and lower electrode of polycrystalline silicon film 43. A memory cell of the DRAM comprising the MISFET Qs for selecting a memory cell and the capacitor element C for storing data connected in series therewith, is completed through up to this step.

Figure 22:
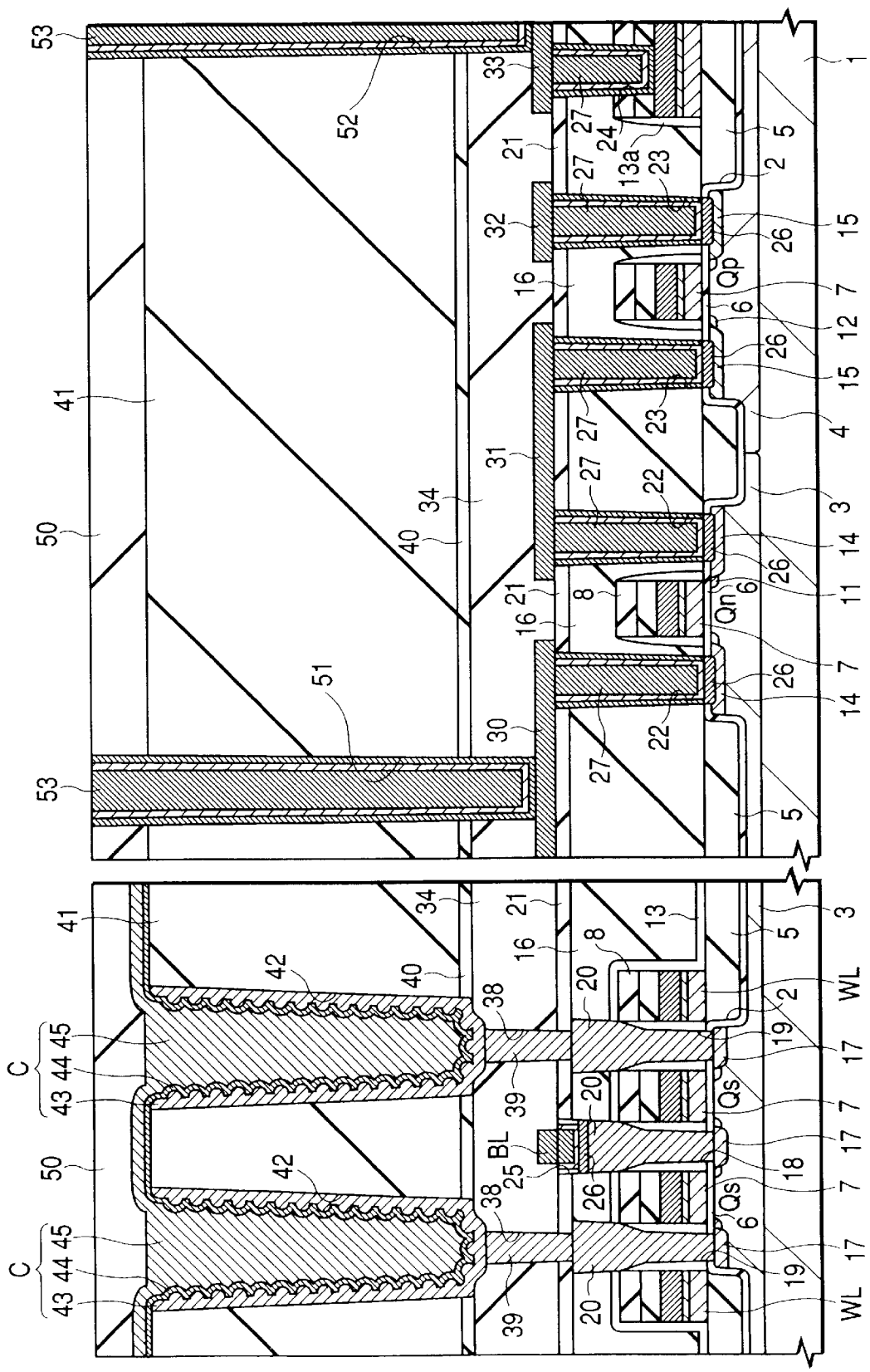
FIG. 22 is a sectional view illustrating a major portion of the semiconductor substrate to explain the fabrication method for semiconductor integrated circuit devices according to the embodiment of the invention.

Referring next, to FIG. 22, a silicon oxide film 50 is deposited while maintaining a thickness of about 100 nm by the CVD method on the capacitor element C for storing data. Here, the thick silicon oxide film 41 remains in the logic region, and the height from the surface of the substrate 1 to the surface of the silicon oxide film 50 is nearly the same between the memory region and the logic region.

Next, the silicon oxide films 50, 41, silicon nitride film 40 and silicon oxide film 34 on the wirings 30 to 33 of the first layer in the logic region are dry-etched by using a photoresist film (not shown) as a mask to form through holes 51, 52 and, then, plugs 53 are formed in the through holes 51, 52. The plugs 53 are formed by, for example, depositing a TiN film while maintaining a thickness of about 100 nm by sputtering on the silicon oxide film 50, further depositing a W film while maintaining a thickness of about 500 nm thereon by the CVD method, and etching-back these films so that they remain in the through holes 51, 52.

Next, wirings of a second layer are formed on the silicon oxide film 50 by a method described below.

Figure 23:
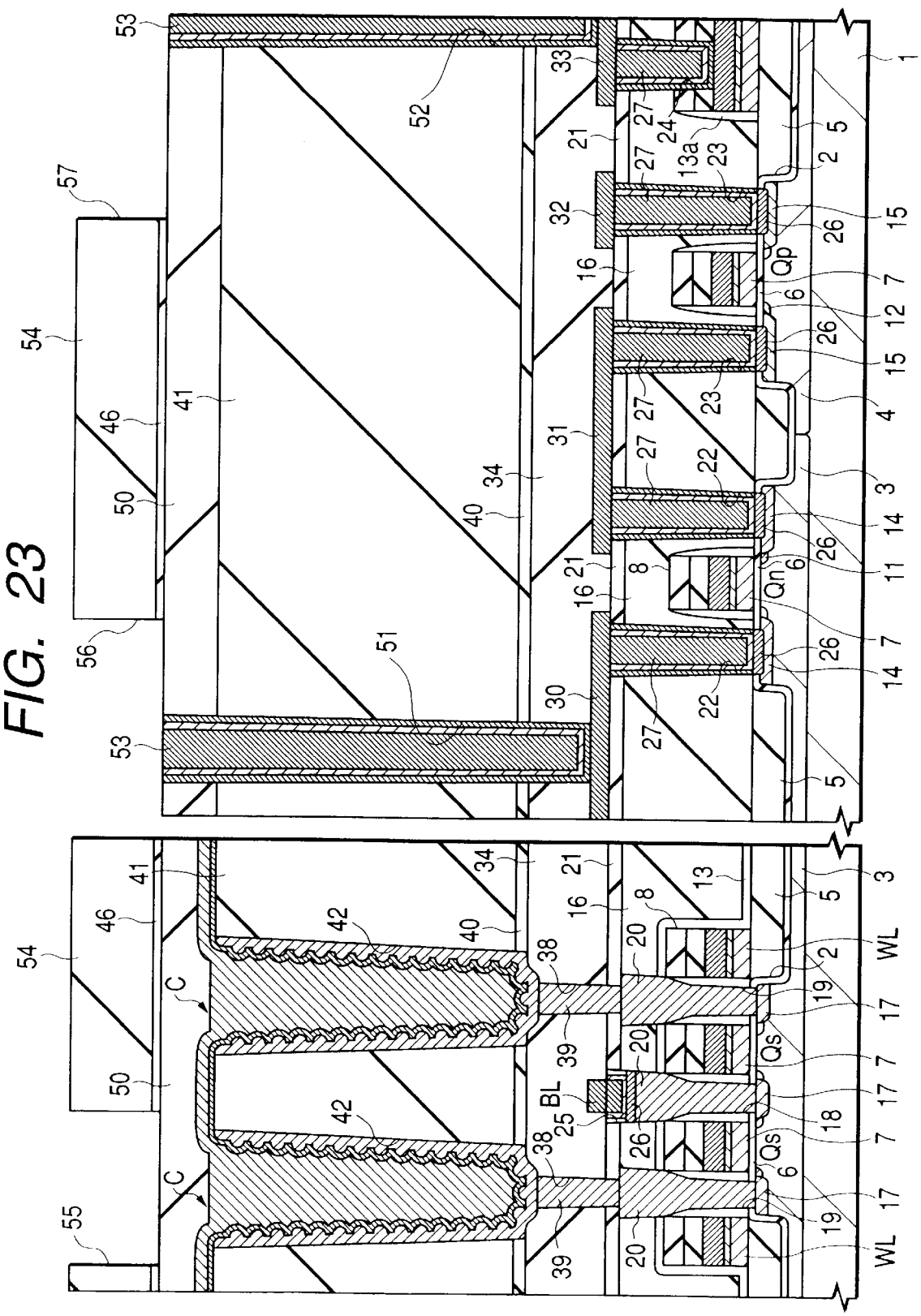
FIG. 23 is a sectional view illustrating a major portion of the semiconductor substrate to explain the fabrication method for semiconductor integrated circuit devices according to the embodiment of the invention.

Referring, first, to FIG. 23, a silicon nitride film 46 of a thickness of from about 50 nm to about 100 nm and a silicon oxide film 54 of a thickness of from about 500 nm to about 600 nm are deposited by the CVD method on the silicon oxide film 50. Then, the silicon oxide film 54 is dry-etched using a photoresist (not shown) as a mask and, then, the silicon nitride film 46 is dry-etched to form wiring grooves 55, 56 and 57. The silicon nitride film 46 is used as a stopper film that prevents the underlying silicon oxide film 50 from being etched at the time of etching the silicon oxide film 54.

Referring next to FIG. 24, a thin electrically conducting barrier film 58 is deposited on the inside of the wiring grooves 55 to 57 and on the silicon oxide film 54 and, then, a copper film 59 is deposited while maintaining a thickness of about 600 nm by sputtering on the electrically conducting barrier film 58. The copper film 59 may be constituted by a copper alloy containing not less than about 80% of copper in addition to being constituted by copper of a highly pure form.

Copper has a property of being easily diffused in the silicon oxide film. When copper wirings are formed in the wiring grooves 55 to 57, therefore, copper diffuses into the silicon oxide film 54 causing a short-circuit among the wirings and increasing parasitic capacity among the wirings due to a rise in the dielectric constant of the silicon oxide film 54. Further, copper poorly adheres onto the insulating material such as silicon oxide and tends to be easily peeled off on the interface relative to the silicon oxide film 54. When the copper wirings are to be formed in the wiring grooves 55 to 57, therefore, diffusion of copper must be suppressed between the silicon oxide film 54 and the copper film 59, and an electrically conducting barrier film 58 must be provided that intimately adheres to the insulating material. The electrically conducting barrier film 58 comprises a TiN film deposited by, for example, a CVD method (or sputtering method). The electrically conducting barrier film 58 may further be formed of a high-melting metal nitride such as WN or TaN (tantalum nitride) or a material obtained by adding Si (silicon) to the high-melting metal nitride, or a high-melting metal that difficultly reacts with copper, such as Ta, Ti, W or TiW alloy.

The copper film 59 deposited by sputtering on the silicon oxide film 54 is not buried in its form in the wiring grooves 55 to 57 to a sufficient degree. Therefore, a reflow processing is executed by annealing the copper film 59 to enhance its fluidity so as to cause the copper film 59 to flow into the wiring grooves 55 to 57.

The copper film 59 must be annealed to enhance its fluidity while suppressing the diffusion of copper. Therefore, the lamp annealing device is used to effect the annealing at a temperature range of not lower than 200° C. but lower than 600° C., preferably, not lower than 200° C. but lower than 550° C. and, more preferably, not lower than 200° C. but lower than 500° C. Here, in order to prevent the copper film 59 from being oxidized, the annealing is effected in a reducing atmosphere containing hydrogen as a chief component.

However, copper has a property of reflecting almost all (not less than 99%) of the light from the lamps exhibiting a peak in the wavelength region of about 1 $\mu$m. When the main surface of the wafer 1 on which the copper film 59 is formed is irradiated with light from the lamps, therefore, a very large lamp power is required for obtaining a required wafer temperature, decreasing the throughput of the reflow processing and increasing the consumption of power by the lamps.

Figure 25A:
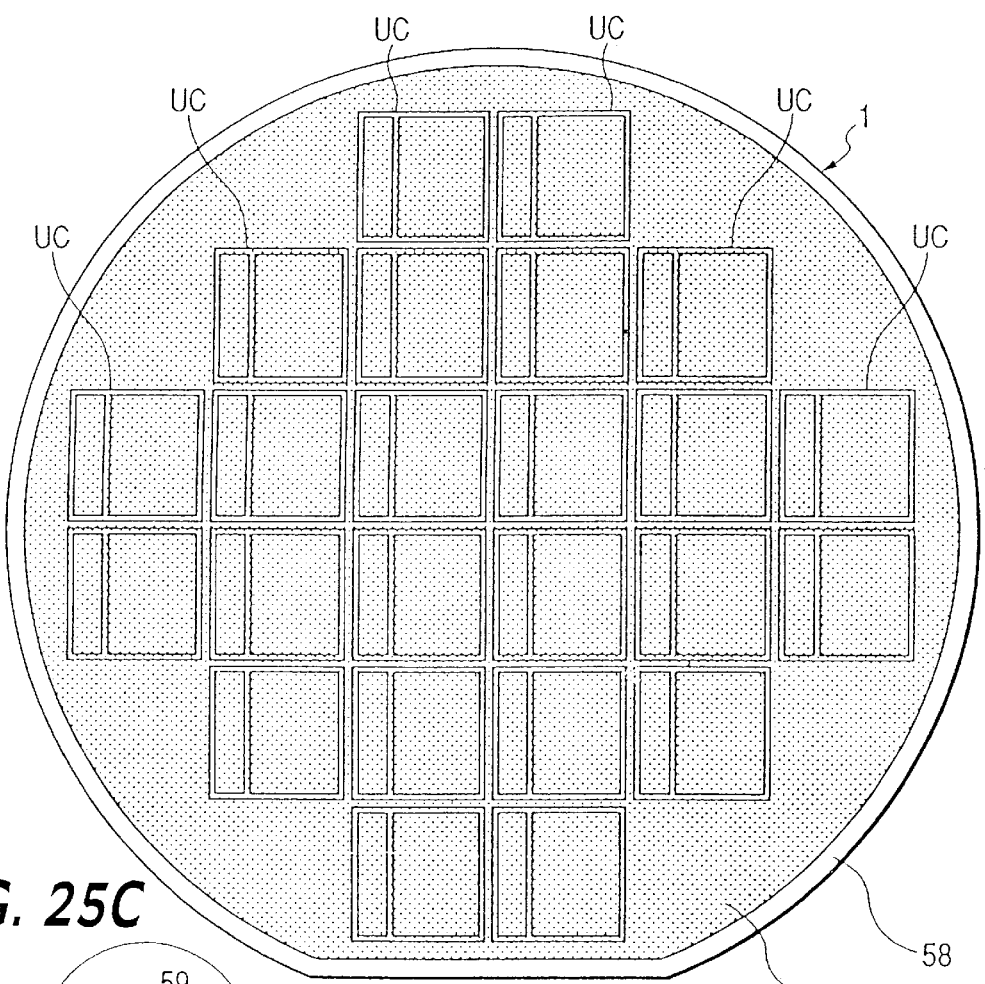
FIG. 25 is a plan view and a sectional view of the whole wafer on which an electrically conducting barrier film and a copper film are formed.
Figure 25C:
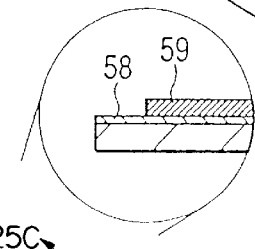
Figure 25B:
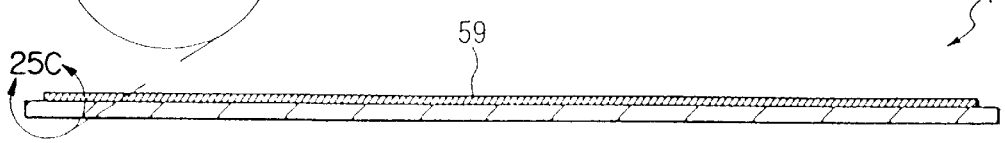

When the main surface of the wafer 1 on which the copper film 59 is formed is irradiated with light from the lamps, further, there arises a problem of dispersion in the temperature in the surface of the wafer. FIG. 25 is a plan view and a schematic sectional view illustrating the main surface (device surface) of the wafer 1 on which the electrically conducting barrier film 58 and the copper film 59 are deposited. When the copper film 59 is formed on the main surface of the wafer 1 as shown, there is often provided a, region where the copper film 59 is not formed while maintaining a width of about several millimeters along the outermost circumference of the wafer on the outer side of the chip-forming portion. This is because the copper film 59 formed along the outermost circumference of the wafer peels off at the end of the wafer when the wafer 1 is being handled, and the wafer 1 may be contaminated. To form the buried copper wirings in the wiring grooves 55 to 57, further, the copper film 59 is caused to reflow, and the undesired copper film 59 on the silicon oxide film 54 is removed by chemical mechanical polishing. However, the copper film 59 along the periphery of the wafer 1 is little removed by the chemical mechanical polishing. Accordingly, the copper film 59 must not be formed along the periphery.

Because of the above reasons, when the main surface of the wafer 1 on which the copper film 59 is formed is irradiated with light from the lamps, the temperature rises less at the central portion of the wafers 1 since the copper film 59 reflects almost all of the light from the lamps, whereas the temperature quickly rises at the periphery of the wafer where the copper film 59 is not formed since the light from the lamps is efficiently absorbed, developing a large difference in the temperature between the central portion and the peripheral portion of the wafer 1. As a result, when the central portion of the wafer 1 is heated at a temperature necessary for causing reflow of the copper film 59, the temperature is abnormally elevated along the periphery, and the copper film 59 is diffused in large amounts in the unit chip regions UC in the periphery.

Figure 26:
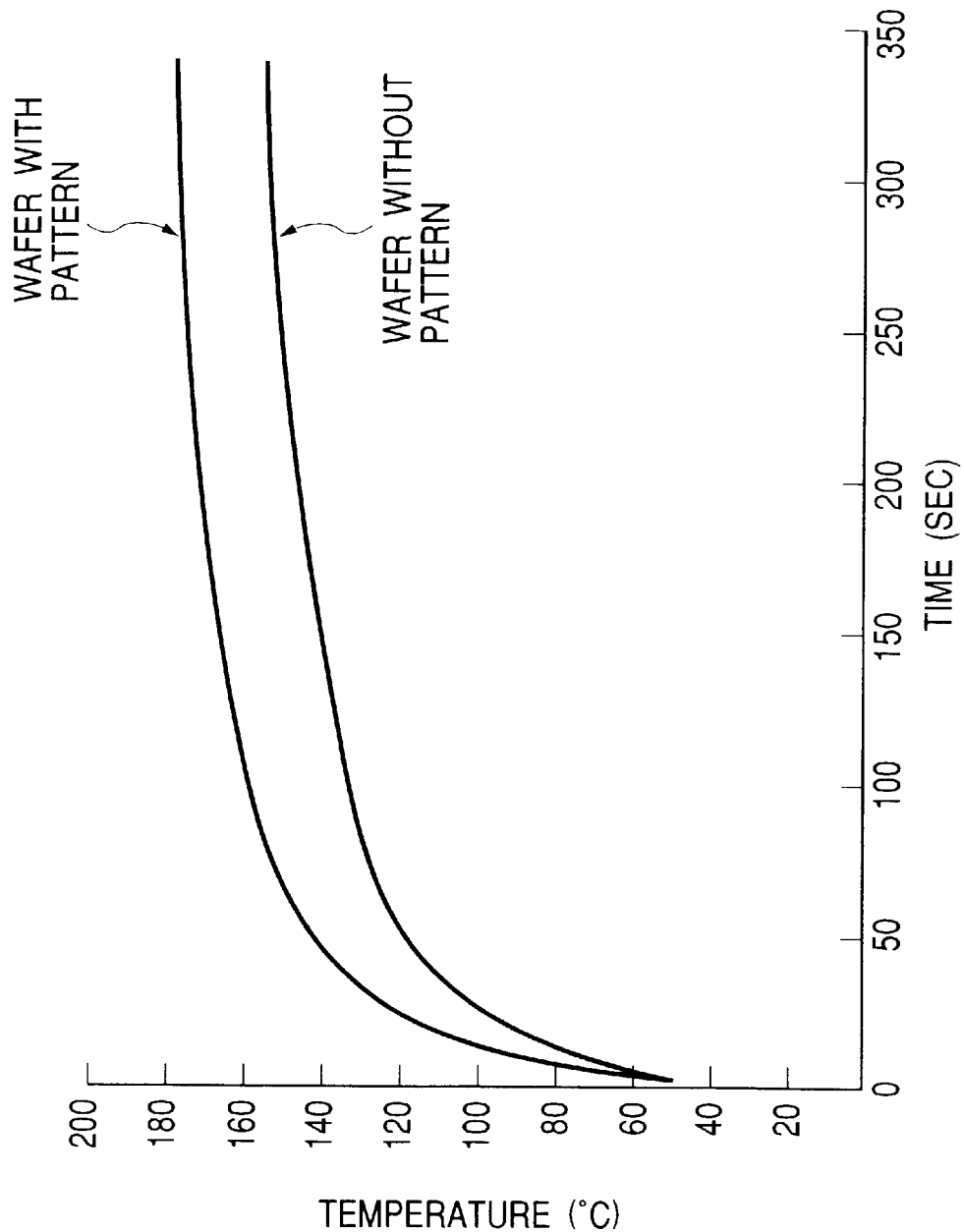
FIG. 26 is a graph illustrating changes in the temperature of wafers of when a copper film is deposited on a wafer on which an integrated circuit pattern has been formed and on a flat wafer without pattern, and when these wafers are irradiated with light from lamps.

Further, dispersion in the temperature in the surface of the wafer 1 on which the copper film 59 is formed also stems from the density of the integrated circuit pattern formed on the wafer. FIG. 26 is a graph illustrating changes in the temperature of the wafers when a wafer on which an integrated circuit pattern is formed and a flat wafer without a pattern are irradiated with light from the lamps, the wafers having a copper film deposited thereon, respectively. As shown, the wafer on which the integrated circuit pattern is formed is heated at a temperature higher than the flat wafer without a pattern due to a difference in the emissivity caused by the pattern density. Therefore, when the memory region and the logic region exist in a mixed manner in the unit chip region UC like in the memory-logic hybrid LSI of this embodiment, the memory region where the elements are highly densely formed is heated at a temperature higher than the logic region on where the elements are formed less densely, creating a dispersion in the fluidity of the copper film 59 and in the amount of dispersion of copper even in the same unit chip region UC.

According to this embodiment, therefore, the copper film 59 is annealed by using the annealing device 100 equipped with the light-shielding plate 106 shown in FIG. 7. The copper film 59 is annealed over a temperature range of from 250° C. to 450° C. In order to prevent the copper film 59 from being oxidized, further, the annealing is effected in a hydrogen atmosphere or in an atmosphere containing hydrogen as a main-component. From the standpoint of suppressing the diffusion of copper, furthermore, it is desired that the annealing is effected under the conditions of a temperature-elevating rate of not smaller than 5° C./sec. and an annealing time of not longer than 5 minutes. In this case, the gap between the lower surface of the light-shielding plate 1 and the device surface of the wafer 1 is selected to be not larger than 20 times the thickness of the wafer 1, preferably, not larger than 10 times thereof and, more preferably, not larger than 5 times thereof. Further, the thickness of the light-shielding plate 106 is not larger than three times the thickness of the wafer 1 at the greatest, preferably, not larger than two times thereof and, more preferably, not larger than the thickness of the wafer 1 in terms of the SiC heat capacity converted thickness.

Figure 27:
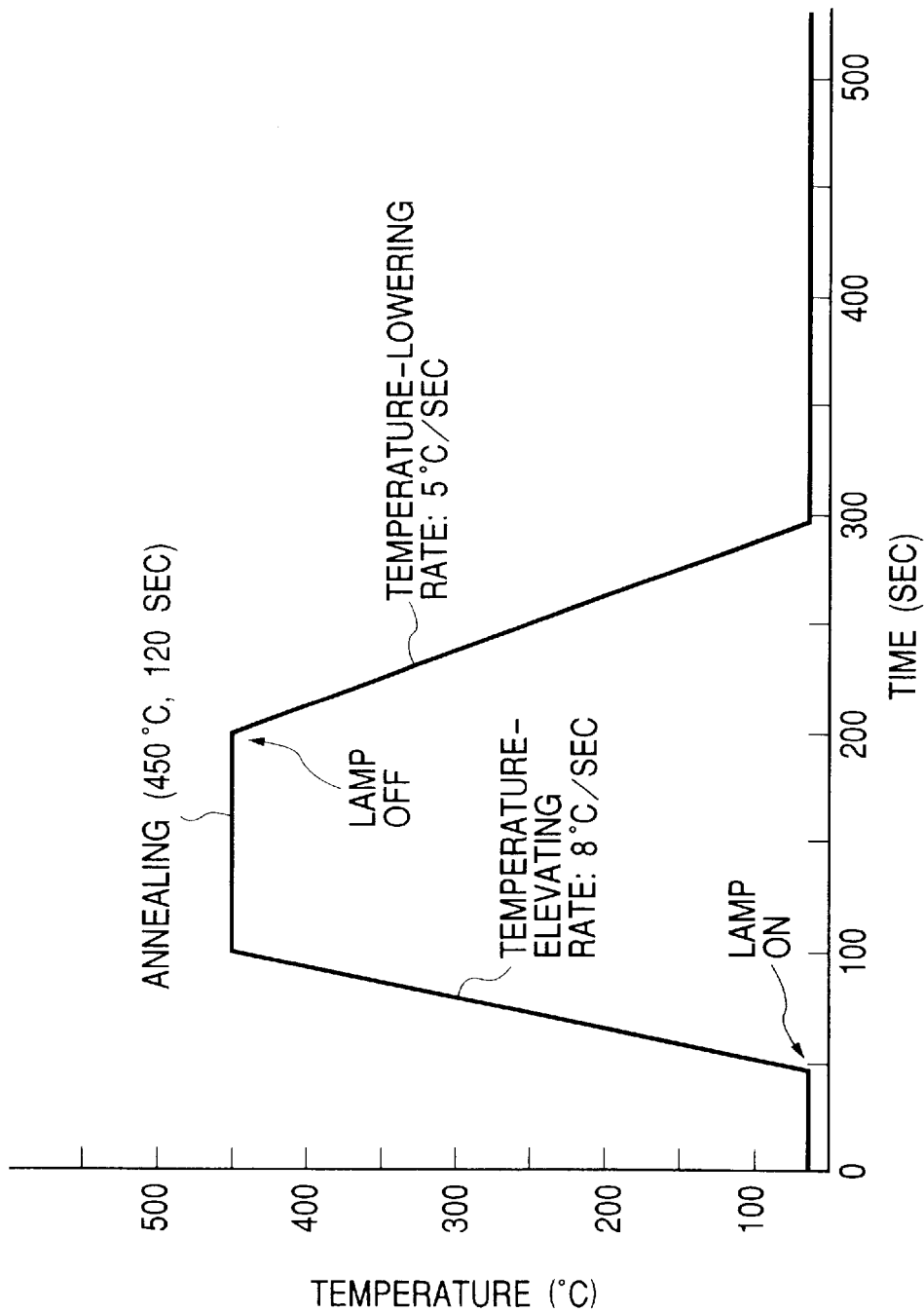
FIG. 27 is a time diagram illustrating a reflow sequence of the copper film.

FIG. 27 illustrates a reflow sequence using the annealing device 100. In this example, first, the wafer 1 is loaded on the susceptor 105 while introducing a hydrogen gas into the chamber 101 of the annealing device 100 to replace the gas in the chamber 101 to a sufficient degree. Then, the lamps 102 are turned on to heat the light-shielding plate 106, and the wafer 1 is heated by heat radiated from the light-shielding plate 106. The temperature-elevating rate is set to be 8° C./sec., the annealing is effected at 450° C. for 120 seconds, and the wafer is cooled at a temperature-lowering rate of 5° C./sec.

Figure 28:
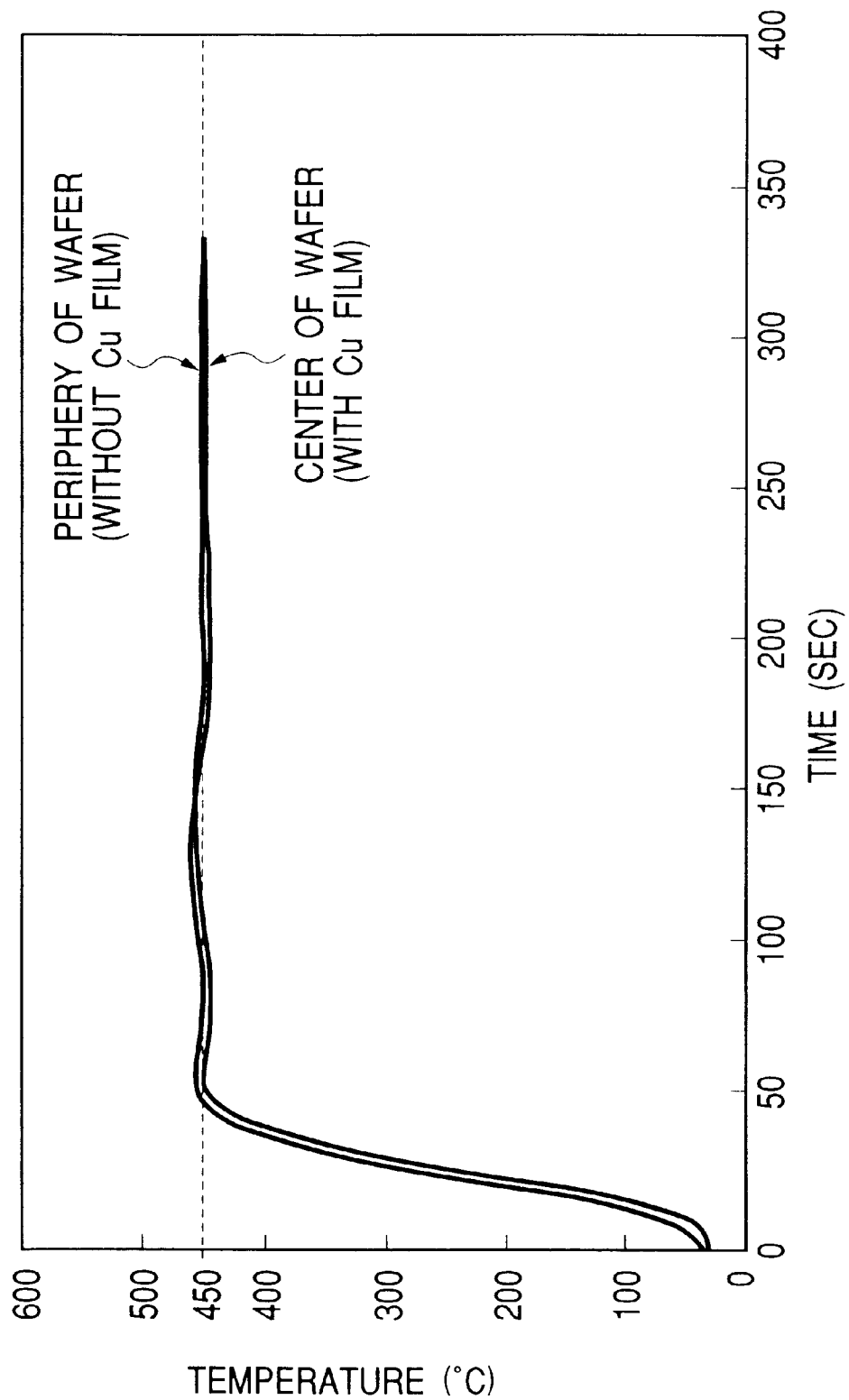
FIG. 28 is a graph illustrating changes in the temperature of the wafers of when the copper film is caused to reflow.

FIG. 28 is a graph illustrating changes in the temperature of the wafer 1 when the annealing is effected under the above conditions. When the wafer 1 is heated by heat radiated from the light-shielding plate 106 as shown, the central portion of the wafer 1 where the copper film 59 is formed and the periphery of the wafer 1 where the copper film 59 is not formed, i.e., where the electrically conducting barrier film 58 of TiN is exposed, are heated at nearly the same temperature-elevating rate.

Figure 29:
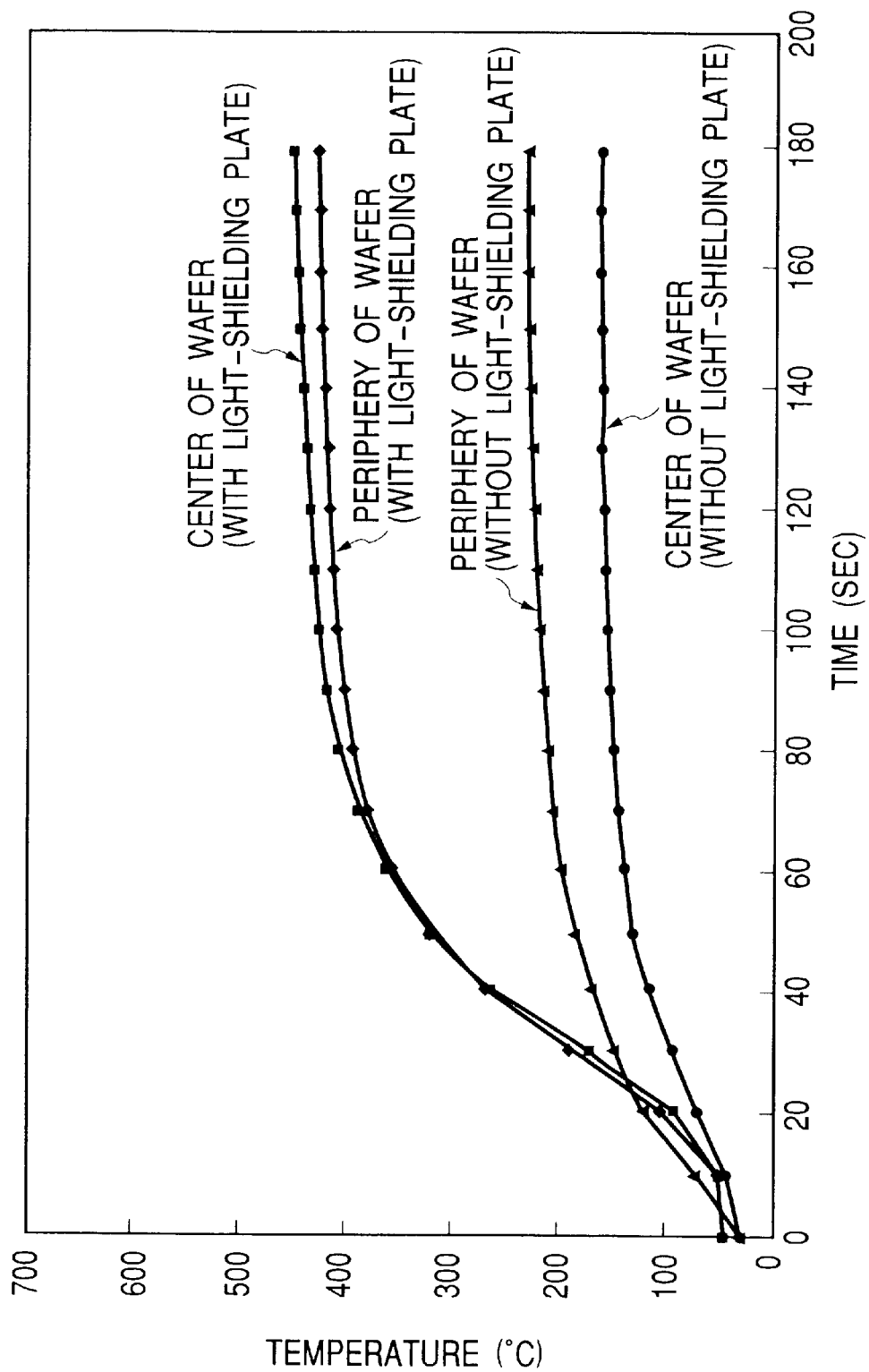
FIG. 29 is a graph illustrating changes in the temperature of the wafers of when the copper film is caused to reflow.

FIG. 29 is a graph illustrating changes in the temperature of the wafers 1 when the copper film 59 is annealed by using the annealing device 100 having the light-shielding plate 106 and the existing annealing device without the light-shielding plate 106. When the annealing device 100 with the light-shielding plate 106 is used as shown, the temperature-elevating rate is great, and the temperature becomes nearly the same between the central portion and the peripheral portion of the wafer 1. On the other hand, when the existing annealing device without the light-shielding plate 106 is used, the temperature-elevating rate is small, and the difference in the temperature increases between the central portion and the peripheral portion of the wafer 1.

Thus, upon annealing the copper film 59 by using the annealing device 100 equipped with the light-shielding plate 106, the temperature distribution is uniformalized between the central portion and the peripheral portion of the wafer 1, and between the memory region and the logic region in the unit chip regions UC, suppressing a dispersion in the reflow of the copper film 59. Further, since the wafer 1 on which the copper film 59 is formed is heated within short periods of time, copper is suppressed from diffusing into the silicon oxide film 54, and the annealing device 100 consumes a decreased amount of electric power.

Figure 30:
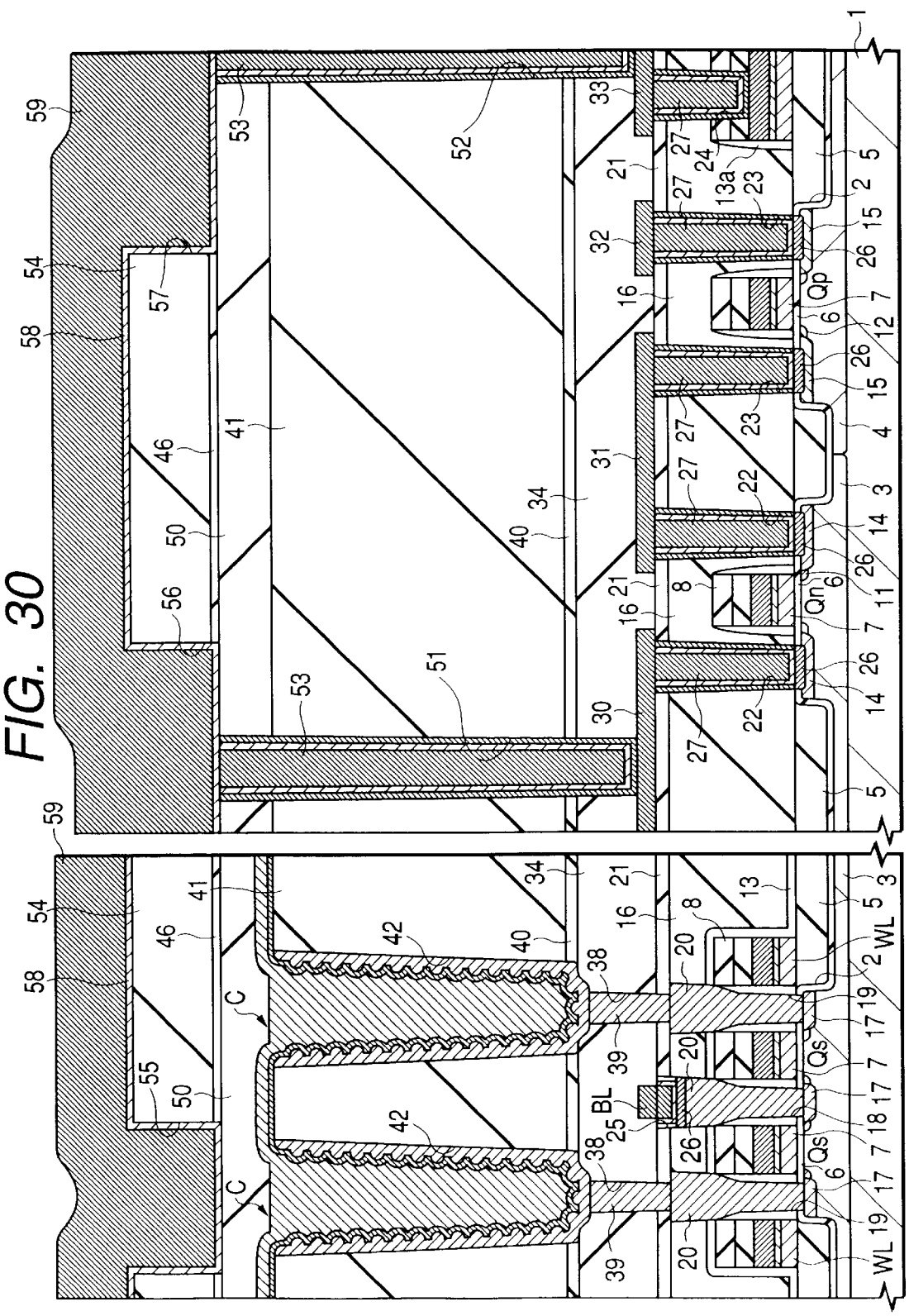
FIG. 30 is a sectional view illustrating a major portion of the semiconductor substrate to explain the fabrication method for semiconductor integrated circuit devices according to the embodiment of the invention.

Upon effecting the reflow processing, the copper film 59 deposited on the silicon oxide film 58 partly flows into the wiring grooves 55 to 57 as shown in FIG. 30; i.e., the interiors of the wiring grooves 55 to 57 are completely filled with the copper film 59.

Figure 31:
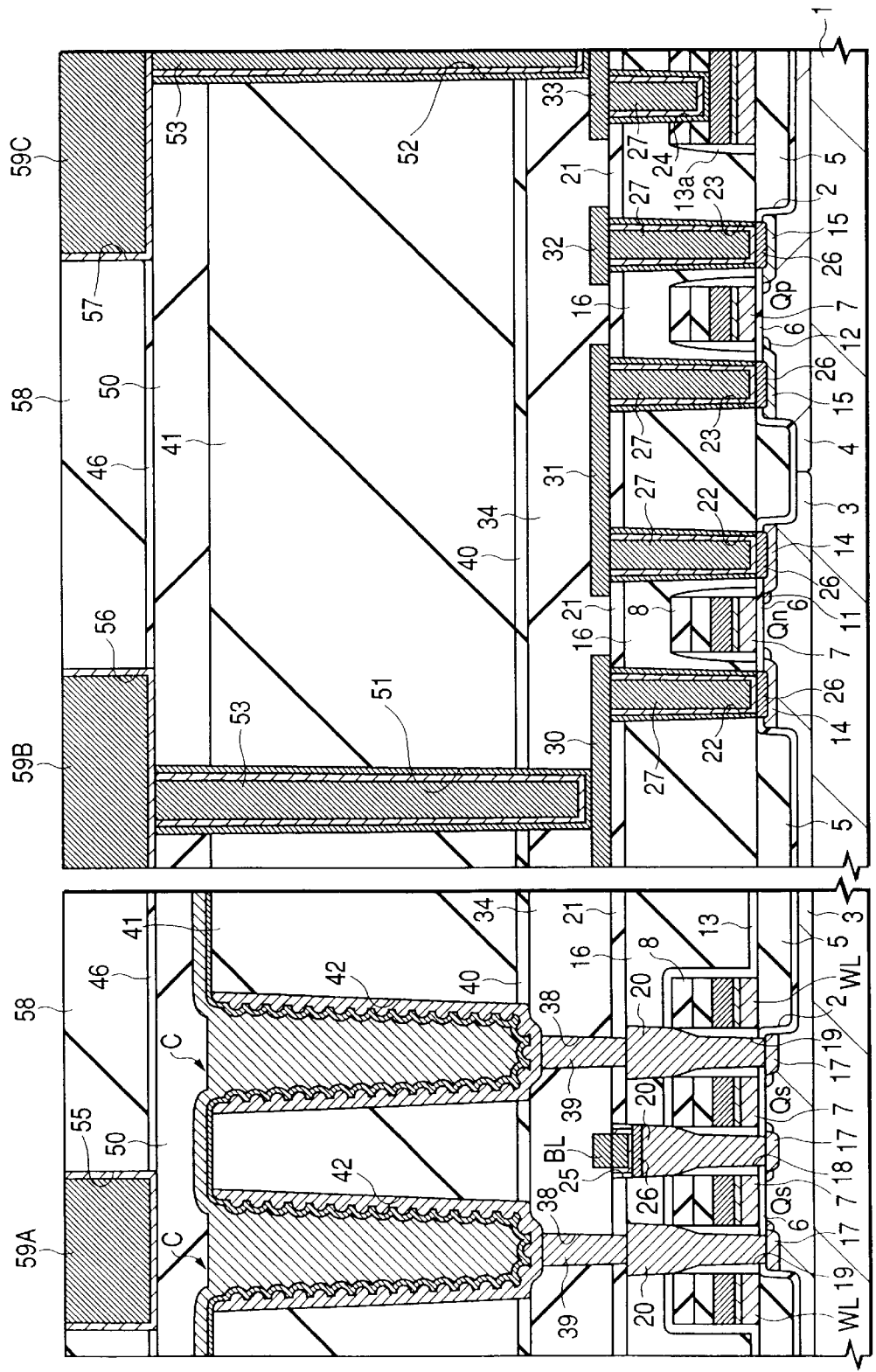
FIG. 31 is a sectional view illustrating a major portion of the semiconductor substrate to explain the fabrication method for semiconductor integrated circuit devices according to the embodiment of the invention.

Referring next to FIG. 31, the copper film 59 on the oxide silicon film 58 and the underlying electrically conducting barrier film 58 are removed by a chemical mechanical polishing, thereby to form buried copper wirings 59A, 59B and 59C in the wiring grooves 55 to 57.

Thereafter, though not illustrated, copper wirings of a plurality of layers are formed on the copper wirings 59A to 59C in the same manner as the one described above to complete the memory-logic hybrid LSI of the embodiment.

In the foregoing the invention accomplished by the present inventors was described by reference to an embodiment. It should, however, be noted that the invention is not limited to the above described embodiment only, but can be modified in a variety of ways without departing from the gist and scope of the invention.

In the above embodiment, the copper film deposited by sputtering was caused to reflow and was chemically and mechanically polished to form the buried copper wirings. However, a copper film formed by electrolytic plating or nonelectrolytic plating may be chemically and mechanically polished to form the buried copper wirings. When the copper film formed by plating is annealed, grains grow enhancing resistance against the electromigration. Further, the annealing promotes the dissociation of impurities in the film. In effecting the annealing, therefore, use of the annealing device 100 equipped with the light-shielding plate 106 makes it possible to obtain a copper film having a uniform film quality on the wafer surface.

Though the above embodiment has employed the single damascene method for forming the buried wirings by polishing the copper film buried in the wiring grooves, the invention can be also adapted to the case of forming the copper wiring by the dual damascene method for forming the buried wirings by polishing the copper film buried in the wiring grooves as well as in the through holes in the lower portions thereof.

In the annealing device of the above embodiment, the lamps were arranged on the upper surface only of the wafer. However, the lamps may be arranged on both the upper surface and the lower surface of the wafer.

The invention can be applied not only to a memory-logic hybrid LSI, but also to a memory LSI and a logic LSI.

Briefly described below are effects obtained by representative examples of the invention disclosed in the specification.

According to the invention, the annealing is effected while maintaining a highly uniform temperature distribution on the wafer surface.

According to the invention, the annealing is effected without causing local dispersion in the temperature that stems from the density of the integrated circuit pattern.

According to the invention, the wafer on which the copper film is formed can be heated to a desired temperature within a short period of time.

What is claimed is:

1. A fabrication method for semiconductor integrated circuit devices comprising the steps of:
    (a) introducing, by ion injection, a first type of impurities into the device surface of a semiconductor integrated circuit wafer having a plurality of unit chip regions on which are formed patterns corresponding to a memory region and to a logic region;
    (b) arranging said device surface of said wafer into which said first type of impurities have been introduced to be close to and opposed to a second main surface of a light-shielding plate having a size larger than a chip-forming portion of said wafer, said light-shielding plate having first and second main surfaces which are optically more uniform than said device surface of said wafer;
    (c) heating said light-shielding plate by irradiating said first main surface of said light-shielding plate with light from lamps in a state where said device surface of said wafer is close to and is opposed to said second main surface of said light-shielding plate; and
    (d) heating said wafer by light radiated from said second main surface of said light-shielding plate that is heated, thereby to anneal said wafer,
    wherein a converted thickness of said light-shielding plate is not larger than the thickness of said wafer, and
    wherein a gap between said second main surface of said light-shielding plate and said device surface of said wafer is not larger than 20 times the thickness of said wafer.

2. A fabrication method for semiconductor integrated circuit devices comprising the steps of:
    (a) introducing, by ion injection, a first type of impurities into the device surface of a semiconductor integrated circuit wafer having a plurality of unit chip regions on which are formed patterns corresponding to a memory region and to a logic region;
    (b) arranging said device surface of said wafer into which said first type of impurities have been introduced to be close to and opposed to a second main surface of a light-shielding plate having a size larger than a chip-forming portion of said wafer, said light-shielding plate having first and second main surfaces which are optically more uniform than said device surface of said wafer;
    (c) heating said light-shielding plate by irradiating said first main surface of said light-shielding plate with light from lamps in a state where said device surface of said wafer is close to and is opposed to said second main surface of said light-shielding plate; and
    (d) heating said wafer by light radiated from said second main surface of said light-shielding plate that is heated, thereby to anneal said wafer,
    wherein a converted thickness of said light-shielding plate is not larger than the thickness of said wafer, and
    wherein a gap between said second main surface of said light-shielding plate and said device surface of said wafer is not larger than 10 times the thickness of said wafer.

3. A fabrication method for semiconductor integrated circuit devices comprising the steps of:
    (a) introducing, by ion injection, a first type of impurities into the device surface of a semiconductor integrated circuit wafer having a plurality of unit chip regions on which are formed patterns corresponding to a memory region and to a logic region;
    (b) arranging said device surface of said wafer into which said first type of impurities have been introduced to be close to and opposed to a second main surface of a light-shielding plate having a size larger than a chip-forming portion of said wafer, said light-shielding plate having first and second main surfaces which are optically more uniform than said device surface of said wafer;
    (c) heating said light-shielding plate by irradiating said first main surface of said light-shielding plate with light from lamps in a state where said device surface of said wafer is close to and is opposed to said second main surface of said light-shielding plate; and
    (d) heating said wafer by light radiated from said second main surface of said light-shielding plate that is heated, thereby to anneal said wafer,
    wherein a converted thickness of said light-shielding plate is not larger than the thickness of said wafer, and wherein a gap between said second main surface of said light-shielding plate and said device surface of said wafer is not larger than 5 times the thickness of said wafer.

4. A fabrication method for semiconductor integrated circuit devices as set forth in claim 3, wherein the hybrid ratio in said unit chip region is not smaller than 15%.

5. A fabrication method for semiconductor integrated circuit devices as set forth in claim 3, wherein the hybrid ratio in said unit chip region is not smaller than 20%.

6. A fabrication method for semiconductor integrated circuit devices as set forth in claim 3, wherein the hybrid ratio in said unit chip region is not smaller than 25%.

7. A fabrication method for semiconductor integrated circuit devices comprising the steps of:
  (a) introducing, by ion injection, a first type of impurities into the device surface of a semiconductor integrated circuit wafer having a plurality of unit chip regions on which patterns are formed;
  (b) arranging said device surface of said wafer into which said first type of impurities have been introduced to be close to and opposed to a second main surface of a light-shielding plate having a size larger than a chip-forming portion of said wafer, and having an SiC heat capacity converted thickness of smaller than the thickness of said wafer, said light-shielding plate having first and second main surfaces which are optically more uniform than said device surface of said wafer;
  (c) heating said light-shielding plate by irradiating said first main surface of said light-shielding plate with light from lamps in a state where said device surface of said wafer is close to and is opposed to said second main surface of said light-shielding plate; and
  (d) heating said wafer by light radiated from said second main surface of said light-shielding plate that is heated, thereby to anneal said wafer, and
wherein a gap between said second main surface of said light-shielding plate and said device surface of said wafer is not larger than 20 times the thickness of said wafer.

8. A fabrication method for semiconductor integrated circuit devices comprising the steps of:
  (a) introducing, by ion injection, a first type of impurities into the device surface of a semiconductor integrated circuit wafer having a plurality of unit chip regions on which patterns are formed;
  (b) arranging said device surface of said wafer into which said first type of impurities have been introduced to be close to and opposed to a second main surface of a light-shielding plate having a size larger than a chip-forming portion of said wafer, and having an SiC heat capacity converted thickness of smaller than the thickness of said wafer, said light-shielding plate having first and second main surfaces which are optically more uniform than said device surface of said wafer;
  (c) heating said light-shielding plate by irradiating said first main surface of said light-shielding plate with light from lamps in a state where said device surface of said wafer is close to and is opposed to said second main surface of said light-shielding plate; and
  (d) heating said wafer by light radiated from said second main surface of said light-shielding plate that is heated, thereby to anneal said wafer, and
wherein a gap between said second main surface of said light-shielding plate and said device surface of said wafer is not larger than 10 times the thickness of said wafer.

9. A fabrication method for semiconductor integrated circuit devices comprising the steps of:
  (a) introducing, by ion injection, a first type of impurities into the device surface of a semiconductor integrated circuit wafer having a plurality of unit chip regions on which patterns are formed;
  (b) arranging said device surface of said wafer into which said first type of impurities have been introduced to be close to and opposed to a second main surface of a light-shielding plate having a size larger than a chip-forming portion of said wafer, and having an SiC heat capacity converted thickness of smaller than the thickness of said wafer, said light-shielding plate having first and second main surfaces which are optically more uniform than said device surface of said wafer;
  (c) heating said light-shielding plate by irradiating said first main surface of said light-shielding plate with light from lamps in a state where said device surface of said wafer is close to and is opposed to said second main surface of said light-shielding plate; and
  (d) heating said wafer by light radiated from said second main surface of said light-shielding plate that is heated, thereby to anneal said wafer, and
wherein a gap between said second main surface of said light-shielding plate and said device surface of said wafer is not larger than 5 times the thickness of said wafer.

10. A fabrication method for semiconductor integrated circuit devices as set forth in claim 9, wherein the hybrid ratio in said unit chip region is not smaller than 15%.

11. A fabrication method for semiconductor integrated circuit devices as set forth in claim 9, wherein the hybrid ratio in said unit chip region is not smaller than 20%.

12. A fabrication method for semiconductor integrated circuit devices as set forth in claim 9, wherein the hybrid ratio in said unit chip region is not smaller than 25%.

13. A fabrication method for semiconductor integrated circuit devices comprising the steps of:
  (a) forming a highly dielectric film or a ferroelectric film on the device surface of a semiconductor integrated circuit wafer having a plurality of unit chip regions on which patterns are formed;
  (b) arranging said device surface of said wafer on which said highly dielectric film or said ferroelectric film is formed to be close to and opposed to a second main surface of a light-shielding plate having a size larger than a chip-forming portion of said wafer, said light-shielding plate having first and second main surfaces which are optically more uniform than said device surface of said wafer;
  (c) heating said light-shielding plate by irradiating said first main surface of said light-shielding plate with light from lamps in a state where said device surface of said wafer is close to and is opposed to said second main surface of said light-shielding plate; and
  (d) heating said wafer by light radiated from said second main surface of said light-shielding plate that is heated, thereby to anneal said highly dielectric film or said ferroelectric film on said wafer,
wherein a converted thickness of said light-shielding plate is not larger than the thickness of said wafer, and
wherein a gap between said second main surface of said light-shielding plate and said device surface of said wafer is not larger than 20 times the thickness of said wafer.

14. A fabrication method for semiconductor integrated circuit devices comprising the steps of:
  (a) forming a highly dielectric film or a ferroelectric film on the device surface of a semiconductor integrated circuit wafer having a plurality of unit chip regions on which patterns are formed;

(b) arranging said device surface of said wafer on which said highly dielectric film or said ferroelectric film is formed to be close to and opposed to a second main surface of a light-shielding plate having a size larger than a chip-forming portion of said wafer, said light-shielding plate having first and second main surfaces which are optically more uniform than said device surface of said wafer;

(c) heating said light-shielding plate by irradiating said first main surface of said light-shielding plate with light from lamps in a state where said device surface of said wafer is close to and is opposed to said second main surface of said light-shielding plate; and (d) heating said wafer by light radiated from said second main surface of said light-shielding plate that is heated, thereby to anneal said highly dielectric film or said ferroelectric film on said wafer, wherein a converted thickness of said light-shielding plate is not larger than the thickness of said wafer, and wherein a gap between said second main surface of said light-shielding plate and said device surface of said wafer is not larger than 10 times the thickness of said wafer.

15. A fabrication method for semiconductor integrated circuit devices comprising the steps of:

(a) forming a highly dielectric film or a ferroelectric film on the device surface of a semiconductor integrated circuit wafer having a plurality of unit chip regions on which patterns are formed;

(b) arranging said device surface of said wafer on which said highly dielectric film or said ferroelectric film is formed to be close to and opposed to a second main surface of a light-shielding plate having a size larger than a chip-forming portion of said wafer, said light-shielding plate having first and second main surfaces which are optically more uniform than said device surface of said wafer;

(c) heating said light-shielding plate by irradiating said first main surface of said light-shielding plate with light from lamps in a state where said device surface of said wafer is close to and is opposed to said second main surface of said light-shielding plate; and (d) heating said wafer by light radiated from said second main surface of said light-shielding plate that is heated, thereby to anneal said highly dielectric film or said ferroelectric film on said wafer, wherein a converted thickness of said light-shielding plate is not larger than the thickness of said wafer, and wherein a gap between said second main surface of said light-shielding plate and said device surface of said wafer is not larger than 5 times the thickness of said wafer.

16. A fabrication method for semiconductor integrated circuit devices comprising the steps of:

(a) forming a metal layer of copper as a chief component on the device surface of a semiconductor integrated circuit wafer having a plurality of unit chip regions on which patterns are formed;

(b) arranging said device surface of said wafer on which said metal layer is formed to be close to and opposed to a second main surface of a light-shielding plate having a size larger than a chip-forming portion of said wafer, said light-shielding plate having first and second main surfaces which are optically more uniform than said device surface of said wafer;

(c) heating said light-shielding plate by irradiating said first main surface of said light-shielding plate with light from a lamp in a state where said device surface of said wafer is close to and is opposed to said second main surface of said light-shielding plate; and (d) heating said wafer by light radiated from said second main surface of said light-shielding plate that is heated, thereby to anneal said metal layer on said wafer, wherein a converted thickness of said light-shielding plate is not larger than the thickness of said wafer, and wherein a gap between said second main surface of said light-shielding plate and said device surface of said wafer is not larger than 20 times the thickness of said wafer.

17. A fabrication method for semiconductor integrated circuit devices comprising the steps of:

(a) forming a metal layer of copper as a chief component on the device surface of a semiconductor integrated circuit wafer having a plurality of unit chip regions on which patterns are formed;

(b) arranging said device surface of said wafer on which said metal layer is formed to be close to and opposed to a second main surface of a light-shielding plate having a size larger than a chip-forming portion of said wafer, said light-shielding plate having first and second main surfaces which are optically more uniform than said device surface of said wafer;

(c) heating said light-shielding plate by irradiating said first main surface of said light-shielding plate with light from a lamp in a state where said device surface of said wafer is close to and is opposed to said second main surface of said light-shielding plate; and (d) heating said wafer by light radiated from said second main surface of said light-shielding plate that is heated, thereby to anneal said metal layer on said wafer, wherein a converted thickness of said light-shielding plate is not larger than the thickness of said wafer, and wherein a gap between said second main surface of said light-shielding plate and said device surface of said wafer is not larger than 10 times the thickness of said wafer.

18. A fabrication method for semiconductor integrated circuit devices comprising the steps of:

(a) forming a metal layer of copper as a chief component on the device surface of a semiconductor integrated circuit wafer having a plurality of unit chip regions on which patterns are formed;

(b) arranging said device surface of said wafer on which said metal layer is formed to be close to and opposed to a second main surface of a light-shielding plate having a size larger than a chip-forming portion of said wafer, said light-shielding plate having first and second main surfaces which are optically more uniform than said device surface of said wafer;

(c) heating said light-shielding plate by irradiating said first main surface of said light-shielding plate with light from a lamp in a state where said device surface of said wafer is close to and is opposed to said second main surface of said light-shielding plate; and (d) heating said wafer by light radiated from said second main surface of said light-shielding plate that is heated, thereby to anneal said metal layer on said wafer, wherein a converted thickness of said light-shielding plate is not larger than the thickness of said wafer, and wherein a gap between said second main surface of said light-shielding plate and said device surface of said wafer is not larger than 5 times the thickness of said wafer.

19. A fabrication method for semiconductor integrated circuit devices as set forth in claim 18, wherein there is a region where said metal layer is not formed in the periphery of said device surface of said wafer in said steps (b) to (d).

* * * * *